US012804961B2

(12) United States Patent
Yang et al.

(10) Patent No.: US 12,804,961 B2
(45) Date of Patent: Nov. 17, 2026

(54) SEMICONDUCTOR DEVICE

(71) Applicant: SAMSUNG ELECTRONICS CO., LTD., Suwon-si (KR)

(72) Inventors: Seong Seok Yang, Suwon-si (KR); Sanghyun Kim, Suwon-si (KR); Jongseob Kim, Suwon-si (KR); Joonyong Kim, Suwon-si (KR); Junhyuk Park, Suwon-si (KR); Jaejoon Oh, Suwon-si (KR); Jung-Wook Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 361 days.

(21) Appl. No.: 18/745,665

(22) Filed: Jun. 17, 2024

(65) Prior Publication Data

US 2025/0169123 A1 May 22, 2025

(30) Foreign Application Priority Data

Nov. 21, 2023 (KR) ........................ 10-2023-0162324

(51) Int. Cl.
*H10D 62/10* (2025.01)
*H10D 30/01* (2025.01)
(Continued)

(52) U.S. Cl.
CPC ........... *H10D 62/10* (2025.01); *H10D 30/475* (2025.01); *H10W 42/00* (2026.01); *H10W 74/43* (2026.01);
(Continued)

(58) Field of Classification Search
CPC ......... H10D 30/47–485; H10D 30/015; H10D 62/10; H10D 62/103; H10D 62/343;
(Continued)

(56) References Cited

U.S. PATENT DOCUMENTS

| | | | |
|---|---|---|---|
| 5,760,453 | A | 6/1998 | Chen |
| 7,902,669 | B2 | 3/2011 | Hwang |

(Continued)

FOREIGN PATENT DOCUMENTS

| | | | |
|---|---|---|---|
| CN | 116325157 | A | 6/2023 |
| EP | 4120363 | A1 | 1/2023 |

OTHER PUBLICATIONS

Extended European Search Report in European Appln. No. 24177774.7, mailed on Nov. 12, 2024, 9 pages.

*Primary Examiner* — Scott B Geyer
(74) *Attorney, Agent, or Firm* — Fish & Richardson P.C.

(57) ABSTRACT

The present disclosure relates to semiconductor devices. An example semiconductor device includes a channel layer, a barrier layer on the channel layer including a material having a different energy band gap than a material included in the channel layer, a gate electrode on the barrier layer, a gate semiconductor layer between the barrier layer and the gate electrode, a protection layer on the barrier layer and the gate electrode, a source electrode and a drain electrode on both sides of the gate electrode and extending through the protection layer to cover the side surfaces of the channel layer and the barrier layer, and a diffusion barrier layer within the protection layer covering the barrier layer and the gate electrode and including Nitrogen.

20 Claims, 22 Drawing Sheets

(51) Int. Cl.

| | |
|---|---|
| ***H10D 30/47*** | (2025.01) |
| ***H10D 62/85*** | (2025.01) |
| ***H10W 42/00*** | (2026.01) |
| ***H10W 74/43*** | (2026.01) |

(52) U.S. Cl.
CPC ....... *H10D 30/015* (2025.01); *H10D 62/8503* (2025.01)

(58) Field of Classification Search
CPC ............. H10D 62/8503; H10D 64/111; H10D 64/112; H10D 64/117; H10D 64/256; H10D 64/257
See application file for complete search history.

(56) References Cited

U.S. PATENT DOCUMENTS

| | | | | |
|---|---|---|---|---|
| 11,152,513 | B2 | 10/2021 | Yamazaki et al. | |
| 2015/0021666 | A1* | 1/2015 | Chen .................... | H10D 30/015 257/194 |
| 2020/0266289 | A1 | 8/2020 | Yamazaki et al. | |
| 2021/0005740 | A1* | 1/2021 | Banerjee .............. | H10D 30/015 |
| 2022/0140126 | A1* | 5/2022 | LaRoche .............. | H10D 30/015 257/183 |
| 2022/0254912 | A1 | 8/2022 | Ramdani | |
| 2022/0384290 | A1 | 12/2022 | Lee et al. | |
| 2023/0029763 | A1 | 2/2023 | Hardiman et al. | |
| 2023/0231022 | A1 | 7/2023 | Yang | |
| 2023/0238445 | A1 | 7/2023 | Lin et al. | |

* cited by examiner

SEMICONDUCTOR DEVICE

CROSS-REFERENCE TO RELATED APPLICATION

This application claims priority to and the benefit of Korean Patent Application No. 10-2023-0162324 filed in the Korean Intellectual Property Office on Nov. 21, 2023, the entire contents of which are incorporated herein by reference.

BACKGROUND

In modern society, semiconductor devices are closely related to a daily life. In particular, an importance of electric power semiconductor devices used in various fields such as transportation fields such as electric vehicles, railways, and electric trams, renewable energy systems such as a solar power generation and a wind power generation, and mobile devices is gradually increasing. An electric power semiconductor device is a semiconductor device used to handle high voltage or high current, and performs functions such as an electric power conversion and a control in large electric power systems or high power electronic devices. The electric power semiconductor devices have an ability and a durability to handle high electric power, handle large amounts of a current, and withstand high voltages. For example, the electric power semiconductor device may handle voltages of hundreds to thousands of bolts and currents of tens of amperes to thousands of amperes. The electric power semiconductor devices may improve an efficiency of an electrical energy by minimizing a power loss. Additionally, the electric power semiconductor devices may be operated stably even in environments such as high temperature.

These electric power semiconductor devices may be classified according to a material, and examples include a SiC electric power semiconductor device and a GaN electric power semiconductor device. By manufacturing the electric power semiconductor devices using SiC or GaN instead of existing silicon wafers (Si wafers), drawbacks of silicon, which has unstable characteristics at high temperatures, may be compensated. The SiC electric power semiconductor devices are resistant to high temperatures and have low power loss, and may be suitable for electric vehicles, renewable energy systems, etc. The GaN electric power semiconductor devices require high costs, but are efficient in terms of a speed and may be suitable for high-speed charging of mobile devices.

SUMMARY

The present disclosure relates to semiconductor devices with stable electric characteristics and improved reliability.

In general, according to some aspects, a semiconductor device includes a channel layer, a barrier layer positioned on the channel layer and including a material having a different energy band gap than the channel layer, a gate electrode positioned on the barrier layer, a gate semiconductor layer positioned between the barrier layer and the gate electrode, a protection layer positioned on the barrier layer and the gate electrode, a source electrode and a drain electrode positioned on both sides of the gate electrode and penetrating the protection layer to cover side surfaces of the channel layer and the barrier layer, and a diffusion barrier layer positioned within the protection layer to cover the barrier layer and the gate electrode and including Nitrogen.

In general, according to some aspects, a semiconductor device includes a channel layer, a barrier layer positioned on the channel layer and including a material with a higher energy band gap than the channel layer, a gate electrode positioned on the barrier layer, a gate semiconductor layer positioned between the barrier layer and the gate electrode, a first protection layer positioned on the gate electrode, a first source electrode and a first drain electrode positioned on both sides of the gate electrode on the first protection layer and connected to the channel layer, a first field dispersion layer positioned to overlap the gate electrode on the first protection layer, a second protection layer positioned on the first source electrode, the first drain electrode, and the first field dispersion layer, a second source electrode connected to the first source electrode on the second protection layer, a second drain electrode connected to the first drain electrode on the second protection layer, a second field dispersion layer positioned to overlap the gate electrode on the second protection layer, a capping layer positioned on the second source electrode, the second drain electrode, and the second field dispersion layer, and a diffusion barrier layer positioned at least within the first protection layer, within the second protection layer, between the first protection layer and the second protection layer, and between the second protection layer and the capping layer, and including Nitrogen.

In general, according to some aspects, a semiconductor device includes a channel layer including GaN, a barrier layer positioned on the channel layer and including AlGaN, a gate electrode positioned on the barrier layer and including a metallic material, a gate semiconductor layer positioned between the barrier layer and the gate electrode and including GaN doped with P-type impurity, a protection layer positioned on the barrier layer and the gate electrode, a source electrode and a drain electrode positioned on both sides of the gate electrode and penetrating the protection layer to be in contact with side surfaces of the channel layer and the barrier layer, a capping layer positioned on the source electrode and the drain electrode, and including at least one of F and Cl, and a diffusion barrier layer positioned within the protection layer to cover the barrier layer and the gate electrode and including at least one of SiN, SiON, SiOCN, and AlN.

In some implementations, an electric characteristic and a reliability of the semiconductor device are improved.

DETAILED DESCRIPTION

Figure 1:
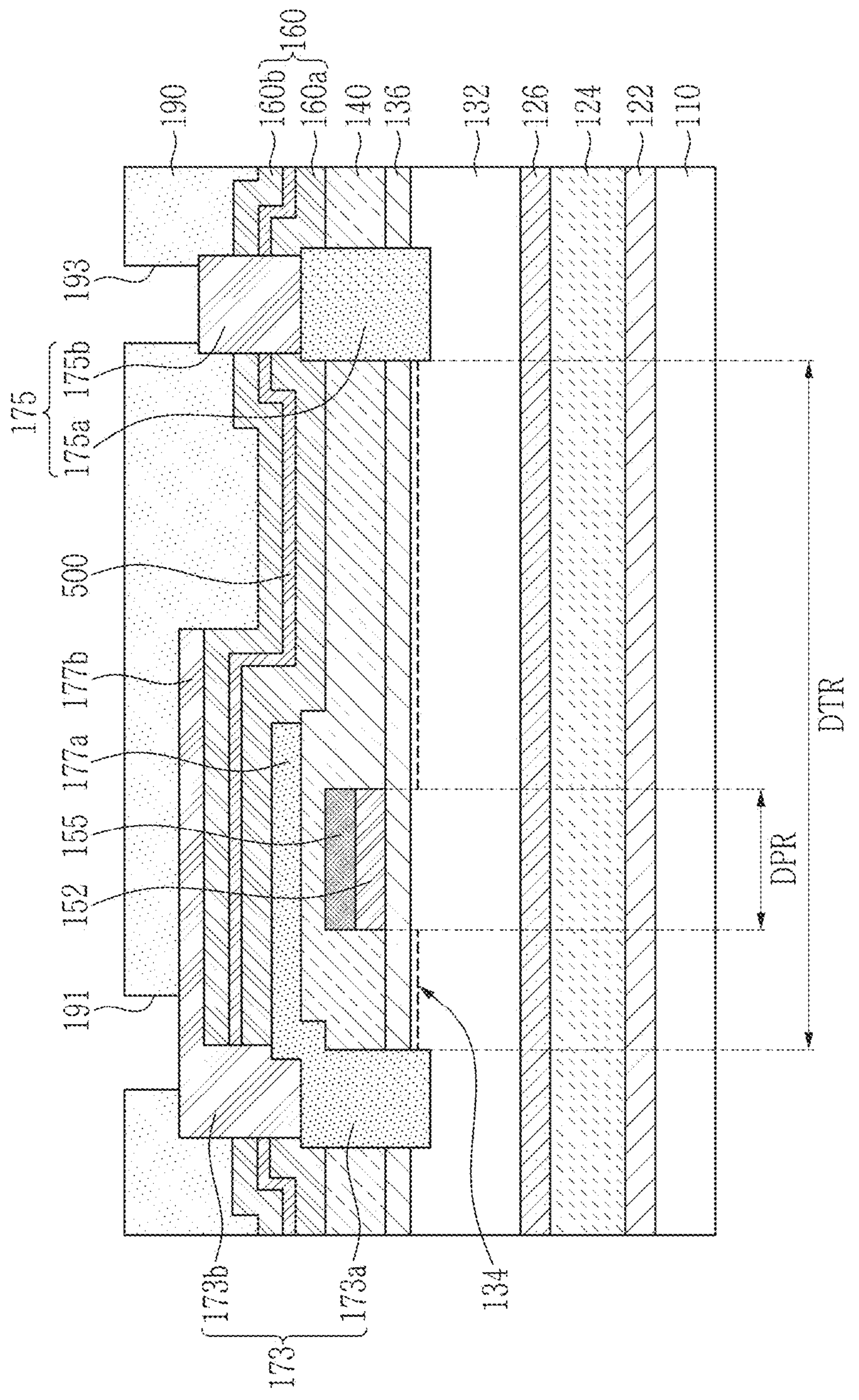
FIG. 1 and FIG. 2 are example cross-sectional views showing a semiconductor device.

The present disclosure will be described more fully hereinafter with reference to the accompanying drawings, in which implementations of the disclosure are shown. As those skilled in the art would realize, the described implementations may be modified in various different ways, all without departing from the spirit or scope of the present disclosure.

To clearly describe the present disclosure, parts that are irrelevant to the description are omitted, and like numerals refer to like or similar constituent elements throughout the specification.

Further, since sizes and thicknesses of constituent members shown in the accompanying drawings are arbitrarily given for better understanding and ease of description, but the present disclosure is not limited to the illustrated sizes and thicknesses. In the drawings, the thickness of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise", and variations such as "comprises" or "comprising", will be understood to imply the inclusion of stated elements but not the exclusion of any other elements.

Further, throughout the specification, the phrase "on a plane" means viewing a target portion from the top, and the phrase "on a cross-section" means viewing a cross-section formed by vertically cutting a target portion from the side.

Hereinafter, a semiconductor device according to an implementation is described with reference to FIG. 1 and to FIG. 2 as follows.

Figure 2:
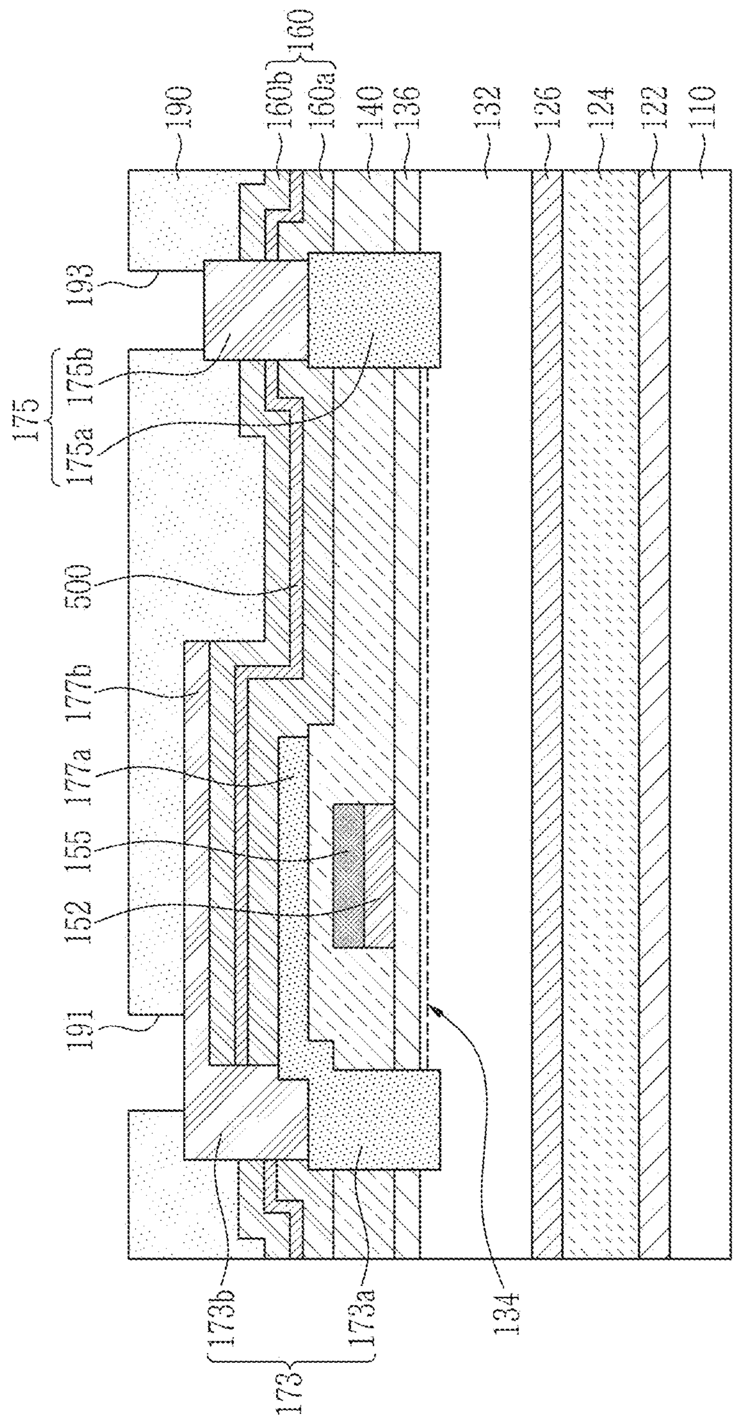

FIG. 1 and FIG. 2 are example cross-sectional views showing a semiconductor device. FIG. 1 indicates that the semiconductor device is in an off state. FIG. 2 represents a case where the semiconductor device is in an on state.

First, as shown in FIG. 1, a semiconductor device includes a channel layer 132, a barrier layer 136 positioned on the channel layer 132, a gate electrode 155 positioned on the barrier layer 136, a gate semiconductor layer 152 positioned between the barrier layer 136 and the gate electrode 155, a source electrode 173 and a drain electrode 175 separated from each other on the channel layer 132, a protection layer 140 and 160 positioned on the barrier layer 136 and the gate electrode 155, and a diffusion barrier layer 500 positioned within the protection layer 140 and 160.

The channel layer 132 is a layer that forms a channel between the source electrode 173 and the drain electrode 175, and a 2-dimensional electron gas (2DEG) 134 may be positioned inside the channel layer 132. The 2-dimensional electron gas 134 is a charge transport model used in solid physics, and refers to a group of electrons that can move freely in a 2-dimensional (e.g., a x-y planar direction) but cannot move in another dimension (e.g., a z direction) and are tightly bound within a 2-dimensional space. In other words, the 2-dimensional electron gas 134 may exist in a 2-dimensional paper-like form within a 3-dimensional space. This 2-dimensional electron gas 134 mainly appears in a semiconductor heterojunction structure, and may occur at the interface between the channel layer 132 and the barrier layer 136 in the semiconductor device. For example, the 2-dimensional electron gas 134 may be generated in the portion closest to the barrier layer 136 within the channel layer 132.

The channel layer 132 may include one or more materials selected from Group III-V materials, for example, nitrides at least one among Al, Ga, In, and B. The channel layer 132 may be composed of a single layer or multiple layers. The channel layer 132 may be $Al_xIn_yGa_{(1-x-y)}N$ ($0 \le x \le 1$, $0 \le y \le 1$, $x+y \le 1$). For example, the channel layer 132 may include at least one of AlN, GaN, InN, InGaN, AlGaN, AlInN, and AlInGaN. The channel layer 132 may be a layer with a doped impurity or a layer with a undoped impurity. The thickness of the channel layer 132 may be about several hundred nm or less.

The channel layer 132 may be positioned on the substrate 110, and a buffer layer 122, a superlattice layer 124, and a high-resistance layer 126 may be positioned between the substrate 110 and the channel layer 132. The substrate 110, the buffer layer 122, and the superlattice layer 124 are layers necessary to form the channel layer 132, and may be omitted in some cases. For example, when a substrate made of GaN is used as the channel layer 132, at least one of the substrate 110, the buffer layer 122, and the superlattice layer 124 may be omitted. Considering that the price of a substrate made of GaN is relatively high, the channel layer 132 including GaN may be grown using the substrate 110 made of Si. At this time, as a lattice structure of Si and a lattice structure of GaN are different, it may not be easy to grow the channel layer 132 directly on the substrate 110. Accordingly, the buffer layer 122 and the superlattice layer 124 may be grown on the substrate 110 first, and then the channel layer 132 may be grown on the superlattice layer 124. Additionally, at least one of the substrate 110, the buffer layer 122, and the superlattice layer 124 may be removed from the final structure of the semiconductor device after being used in the manufacturing process.

The substrate 110 may include a semiconductor material. For example, the substrate 110 may include sapphire, Si, SiC, AlN, GaN, or a combination thereof. The substrate 110 may be a silicon on insulator (SOI) substrate. However, the material of the substrate 110 is not limited to this, and any generally-used substrate may be applied. In some cases, the substrate 110 may include an insulating material. For example, after forming first several layers, including the channel layer 132, on the semiconductor substrate, then the semiconductor substrate may be removed to be replaced with an insulation substrate.

The buffer layer 122 may be positioned on the substrate 110. A seed layer may be further positioned between the substrate 110 and the buffer layer 122. The seed layer may be positioned directly on the substrate 110. However, it is not limited to this, and another predetermined layer may be further positioned between the substrate 110 and the seed layer. The seed layer is a layer that serves as a seed for growing the buffer layer 122, and may be made of a crystal lattice structure that becomes the seed of the buffer layer 122. For example, the seed layer may include AlN, but it is not limited thereto. The buffer layer 122 may be positioned directly on the seed layer. However, it is not limited to this, and another predetermined layer may be positioned between the seed layer and the buffer layer 122.

The buffer layer 122 may be positioned between the substrate 110 and the superlattice layer 124. The buffer layer 122 is a layer to alleviate differences in lattice constants and thermal expansion coefficients between the substrate 110 and the channel layer 132. The buffer layer 122 may include one or more materials selected from Group III-V materials, such as nitrides including at least one among Al, Ga, In, B. The buffer layer 122 may be $Al_xIn_yGa_{(1-x-y)}N$ ($0 \le x \le 1$, $0 \le y \le 1$, $x+y \le 1$). For example, the buffer layer 122 may include at least one of AlN, GaN, InN, InGaN, AlGaN, AlInN, and AlInGaN. The buffer layer 122 may be composed of a single layer or multiple layers.

The superlattice layer 124 may be positioned on the buffer layer 122. The superlattice layer 124 may be positioned directly on the buffer layer 122. However, it is not limited to this, and another predetermined layer may be positioned between the buffer layer 122 and the superlattice layer 124. The superlattice layer 124 may be positioned between the buffer layer 122 and the channel layer 132. Like the buffer layer 122, the superlattice layer 124 alleviates the difference in lattice constants and thermal expansion coefficients between the substrate 110 and the channel layer 132, thereby reducing a tensile stress and a compressive stress generated between the substrate 110 and the channel layer 132, and it is a layer to relieve a compressive stress and to relieve a stress between entire layers formed by a growth in the final structure of the semiconductor device. The superlattice layer 124 may include one or more materials selected from Group III-V materials, such as nitrides including at least one among Al, Ga, In, B. The superlattice layer 124 may be $Al_xIn_yGa_{(1-x-y)}N$ ($0 \le x \le 1$, $0 \le y \le 1$, $x+y \le 1$). For example, the superlattice layer may include at least one among AlN, GaN, InN, InGaN, AlGaN, AlInN, AlInGaN. The superlattice layer 124 may be composed of a single layer or multiple layers. For example, the superlattice layer 124 may have a structure in which a layer made of AlGaN and a layer made of GaN are repeatedly stacked. For example, AlGaN/GaN/AlGaN/GaN/AlGaN/GaN may be sequentially stacked to form a superlattice layer. The number of AlGaN layers and GaN that make up the superlattice layer 124 may be changed in various ways, and the material that makes up the superlattice layer 124 may be changed in various ways.

The high-resistance layer 126 may be positioned on the superlattice layer 124. The high-resistance layer 126 may be positioned directly on the superlattice layer 124. However, it is not limited to this, and other predetermined layers may be positioned between the superlattice layer 124 and the high-resistance layer 126. The high-resistance layer 126 may be positioned between the superlattice layer 124 and the channel layer 132. The high-resistance layer 126 is to prevent the semiconductor device from being degraded by preventing a parasitic current (a leakage current) from flowing through the channel layer 132. The high-resistance layer 126 may be made of a material with low conductivity so that the substrate 110 and the channel layer 132 are electrically insulated. The high-resistance layer may include one or more materials selected from Group III-V materials, such as nitrides including at least one among Al, Ga, In, B. The high-resistance layer 126 may be $Al_xIn_yGa_{(1-x-y)}N$ ($0 \le x \le 1$, $0 \le y \le 1$, $x+y \le 1$). For example, the high-resistance layer 126 may include at least one of AlN, GaN, InN, InGaN, AlGaN, AlInN, and AlInGaN. The high-resistance layer 126 may be made of a single layer or multiple layers. The high-resistance layer 126 may be a layer in which impurity is not doped.

The barrier layer 136 may be positioned on the channel layer 132. The barrier layer 136 may be positioned directly on the channel layer 132. However, it is not limited to this, and another predetermined layer may be further positioned between the channel layer 132 and the barrier layer 136. The region of the channel layer 132 that overlaps the barrier layer 136 may be a drift region DTR. The drift region DTR may be positioned between the source electrode 173 and the drain electrode 175. When a potential difference occurs between the source electrode 173 and the drain electrode 175, carriers may move in the drift region DTR. The semiconductor device may be turned on/off depending on whether a voltage is applied to the gate electrode 155 and/or the size of the voltage applied to the gate electrode 155. When a voltage higher than a threshold voltage is applied to the gate electrode 155 and the semiconductor device is turned on, a channel may be created in a depletion region DPR. Accordingly, the movement of the carrier may occur in the drift region DTR. If a voltage lower than the threshold voltage is applied to the gate electrode 155 or no voltage is applied, the channel path may be blocked in the depletion region DPR and the movement of the carrier may not occur.

The barrier layer 136 may include one or more materials selected from Group III-V materials, such as nitrides including at least one among Al, Ga, In, B. The barrier layer 136 may be $Al_xIn_yGa_{(1-x-y)}N$ ($0 \le x \le 1$, $0 \le y \le 1$, $x+y \le 1$). The barrier layer 136 may include at least one of GaN, InN, AlGaN, AlInN, InGaN, AlN, AlInGaN, etc. The energy band gap of the barrier layer 136 may be adjusted by the composition ratio of Al and/or In. The barrier layer 136 may be doped with a predetermined impurity. At this time, the impurity doped in the barrier layer 136 may be a P-type dopant that may provide a hole. For example, the impurity doped in the barrier layer 136 may be magnesium (Mg). By increasing or lowering the impurity doping concentration of the barrier layer 136, the threshold voltage, an on-resistance, etc. of the semiconductor device may be adjusted.

The barrier layer 136 may include a semiconductor material with characteristics different from those of the channel layer 132. The barrier layer 136 may differ from the channel layer 132 in at least one of polarization characteristic, an energy band gap, and a lattice constant. For example, the barrier layer 136 may include a material having a different energy band gap than the channel layer 132. At this time, the barrier layer 136 may have a higher energy band gap than the channel layer 132 and may have a higher electrical polarization rate than the channel layer 132. This barrier layer 136 may cause the 2-dimensional electron gas 134 in the channel layer 132, which has a relatively low electrical polarization rate. In this respect, the barrier layer 136 may also be called a channel supply layer or a 2-dimensional electron gas supply layer. The 2-dimensional electron gas 134 may be formed within a portion of the channel layer 132 positioned below the interface between the channel layer 132 and the barrier layer 136. The 2-dimensional electron gas 134 may have a very high electron mobility.

The barrier layer 136 may be composed of a single layer or multiple layers. If the barrier layer 136 is made of multiple layers, the energy band gap of the material of each layer constituting the multiple layers may be different. At this time, the multiple layers constituting the barrier layer 136 may be arranged so that the energy band gap increases as it approaches the channel layer 132.

The gate electrode 155 may be positioned on the barrier layer 136. The gate electrode 155 may overlap some regions of the barrier layer 136. The gate electrode 155 may overlap a part of the drift region DTR of the channel layer 132. The gate electrode 155 may be positioned between the source electrode 173 and the drain electrode 175. The gate electrode 155 may be separated from the source electrode 173 and the drain electrode 175.

The gate electrode 155 may include a conductive material. For example, the gate electrode 155 may include a metal, a metal alloy, a conductive metal nitride, a metal silicide, a doped semiconductor material, a conductive metal oxide, or a conductive metal oxynitride. For example, the gate electrode 155 may include titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonizationnitride (TiAlC—N), titanium aluminum carbide (TiAlC), titanium carbide (TIC), tantalum carbonizationnitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or combination thereof, but it is not limited thereto. The gate electrode 155 may be made of a single layer or multiple layers.

The gate semiconductor layer 152 may be positioned between the barrier layer 136 and the gate electrode 155. That is, the gate semiconductor layer 152 may be positioned on the barrier layer 136, and the gate electrode 155 may be positioned on the gate semiconductor layer 152. The gate electrode 155 may be in schottky contact with the gate semiconductor layer 152. However, it is not limited to this, and in some cases, the gate electrode 155 may be in ohmic contact with the gate semiconductor layer 152. The gate semiconductor layer 152 may overlap the gate electrode 155. At this time, the gate semiconductor layer 152 may completely overlap the gate electrode 155 in the vertical direction. The vertical direction may mean a vertical direction to the upper surface of the channel layer 132 or the barrier layer 136. The upper surface of the gate semiconductor layer 152 may be entirely covered by the gate electrode 155. That is, the gate semiconductor layer 152 may have a planar shape substantially equivalent to that of the gate electrode 155.

The gate semiconductor layer 152 may be positioned between the source electrode 173 and the drain electrode 175. The gate semiconductor layer 152 may be separated from the source electrode 173 and the drain electrode 175. The gate semiconductor layer 152 may be positioned closer to the source electrode 173 than the drain electrode 175. That is, the separation distance between the gate semiconductor layer 152 and the source electrode 173 may be smaller than the separation distance between the gate semiconductor layer 152 and the drain electrode 175.

The gate semiconductor layer 152 may include one or more materials selected from Group III-V materials, such as nitrides including at least one among Al, Ga, In, B. The gate semiconductor layer 152 may be $Al_xIn_yGa_{(1-x-y)}N$ ($0 \le x \le 1$, $0 \le y \le 1$, $x+y \le 1$). For example, gate semiconductor layer 152 may include at least one of AlN, GaN, InN, InGaN, AlGaN, AlInN, AlInGaN. The gate semiconductor layer 152 may include a material having a different energy band gap than the barrier layer 136. For example, the gate semiconductor layer 152 may include GaN, and the barrier layer 136 may include AlGaN. The gate semiconductor layer 152 may be doped to a predetermined impurity. At this time, the impurity doped in the gate semiconductor layer 152 may be a P-type dopant that can provide a hole. For example, the gate semiconductor layer 152 may include GaN doped with a P-type impurity. That is, the gate semiconductor layer 152 may be made of a p-GaN layer. However, it is not limited to this, and the gate semiconductor layer 152 may be a p-AlGaN layer. The impurity doped in the gate semiconductor layer 152 may be magnesium (Mg). The gate semiconductor layer 152 may be made of a single layer or multiple layers.

A depletion region DPR may be formed within the channel layer 132 by the gate semiconductor layer 152. The depletion region DPR may be positioned within the drift region DTR and may have a narrower width than the drift region DTR. As the gate semiconductor layer 152, which has a different energy band gap from the barrier layer 136, is positioned on the barrier layer 136, the level of the energy band of the portion of the barrier layer 136 that overlaps the gate semiconductor layer 152 may increase. Accordingly, the depletion region DPR may be formed in the region of the channel layer 132 that overlaps the gate semiconductor layer 152. The depletion region DPR may be a region in the channel path of the channel layer 132 in which the 2-dimensional electron gas 134 is not formed or has a lower electron concentration than the remaining regions. In other words, the depletion region DPR may mean a region where the flow of the 2-dimensional electron gas 134 is disconnected within the drift region DTR. As the depletion region DPR occurs, a current does not flow between the source electrode 173 and the drain electrode 175, and the channel path may be blocked. Accordingly, the semiconductor device may have a normally off characteristic.

That is, the semiconductor device may be a normally off high electron mobility transistor (HEMT). As shown in FIG. 1, In the normal state in which no voltage is applied to the gate electrode 155, a depletion region DPR exists, and the semiconductor device may be in an off state. As shown in FIG. 2, when a voltage higher than the threshold voltage is applied to the gate electrode 155, the depletion region DPR disappears, and the 2-dimensional electron gas 134 within the drift region DTR may be not disconnected and be connected. That is, the 2-dimensional electron gas 134 may be formed throughout the channel path between the source electrode 173 and the drain electrode 175, and the semiconductor device may be turned on. In summary, the semiconductor device may include the semiconductor layers with different electrical polarization characteristics, the semiconductor layer with the relatively high polarization rate may induce the 2-dimensional electron gas 134 in another semiconductor layer heterogeneously jointed thereto. This 2-dimensional electron gas 134 may be used as a channel between the source electrode 173 and the drain electrode 175, and the connection or disconnection of the flow of this 2-dimensional electron gas 134 may be controlled by the bias voltage applied to the gate electrode 155. In the gate off state, the flow of the 2-dimensional electron gas 134 is blocked, so a current may not flow between the source electrode 173 and the drain electrode 175. As the flow of the 2-dimensional electron gas 134 continues in the gate on state, a current may flow between the source electrode 173 and the drain electrode 175.

In the above, the case where the semiconductor device is the normally off high electron mobility transistor has been described, but it is not limited thereto. For example, the semiconductor device may be a normally-on high electron mobility transistor. In the case of the normally-on high electron mobility transistor, the gate semiconductor layer 152 may be omitted, and thus the gate electrode 155 may be positioned directly on the barrier layer 130. That is, the gate electrode 155 may be in contact with the barrier layer 130. In this structure, the 2-dimensional electron gas 134 may be used as a channel without a voltage being applied to the gate electrode 155, and a current flow may occur between the source electrode 173 and the drain electrode 175. Additionally, when a negative voltage is applied to the gate electrode 155, the depletion region DPR may occur in which the flow of the 2-dimensional electron gas 134 is disconnected under the gate electrode 155.

The buffer layer 122, the superlattice layer 124, the high-resistance layer 126, the channel layer 132, the barrier layer 136, and the gate semiconductor layer 152 described above may be accumulated sequentially on the substrate 110. In the semiconductor device, at least one of the buffer layer 122, the superlattice layer 124, the high-resistance layer 126, the channel layer 132, the barrier layer 136, and the gate semiconductor layer 152 may be omitted. These buffer layer 122, superlattice layer 124, high-resistance layer 126, channel layer 132, barrier layer 136, and gate semiconductor layer 152 may be made of the same-based semiconductor material, and the material composition ratio of each layer may be different considering the role of each layer and the performance required for the semiconductor device.

The protection layers 140, and 160 may include a first protection layer 140, and a second protection layer 160 positioned on the first protection layer 140. The first protection layer 140 and the second protection layer 160 may cover the upper surface of the barrier layer 136 and the gate electrode 155, and may cover the side surfaces of the gate electrode 155 and the gate semiconductor layer 152. The bottom surface of the first protection layer 140 may be in contact with the barrier layer 136, the gate electrode 155, and the gate semiconductor layer 152. The upper surface of the first protection layer 140 may be in contact with the second protection layer 160. The second protection layer 160 may be separated from the barrier layer 136, the gate electrode 155, and the gate semiconductor layer 152 by the first protection layer 140. Accordingly, the second protection layer 160 may be not in contact with the barrier layer 136, the gate electrode 155, and the gate semiconductor layer 152.

The barrier layer 136 and the gate electrode 155 may be protected by the protection layers 140 and 160 and may be separated from other components. The first protection layer 140 and the second protection layer 160 may include an insulating material. For example, the first protection layer 140 and the second protection layer 160 may include oxide such as $SiO_2$ or $Al_2O_3$, the like. As another example, the first protection layer 140 and the second protection layer 160 may include nitride such as SiN or oxynitride such as SiON. The first protection layer 140 and the second protection layer 160 may include a different material from the diffusion barrier layer 500. The first protection layer 140 and the second protection layer 160 may include the same material or different materials. If the first protection layer 140 and the second protection layer 160 are made of the same material, the boundary between the first protection layer 140 and the second protection layer 160 may not be recognized. The first protection layer 140 and the second protection layer 160 may each be composed of a single layer or multiple layers. For example, the second protection layer 160 may include a second lower protection layer 160*a* and a second upper protection layer 160*b*. The second upper protection layer 160*b* may be positioned on the second lower protection layer 160*a*. Although not shown, the first protection layer 140 may also include a first lower protection layer and a second upper protection layer. In some cases, at least one of the first protection layer 140 and the second protection layer 160 may include three or more layers.

The source electrode 173 and the drain electrode 175 may be positioned on the channel layer 132. The source electrode 173 and the drain electrode 175 may be spaced apart from each other, and the gate electrode 155 and the gate semiconductor layer 152 may be positioned between the source electrode 173 and the drain electrode 175. The gate electrode 155 and the gate semiconductor layer 152 are spaced apart from the source electrode 173 and the drain electrode 175. The source electrode 173 may be electrically connected to the channel layer 132 on one side of the gate electrode 155. The drain electrode 175 may be electrically connected to the channel layer 132 on the other side of the gate electrode 155. The source electrode 173 and the drain electrode 175 may be positioned outside the drift region DTR of the channel layer 132. The interface between the source electrode 173 and the channel layer 132 may be one edge of the drift region DTR. Likewise, the interface between the drain electrode 175 and the channel layer 132 may be the other edge of the drift region DTR. However, the present disclosure is not limited to this, and the source electrode 173 and drain electrode 175 may not be positioned outside the drift region DTR of the channel layer 132. At this time, the channel layer 132 may not be recessed, and the source electrode 173 and the drain electrode 175 may be positioned on the upper surface of the channel layer 132. The bottom surface of the source electrode 173 and the drain electrode 175 may be in contact with the upper surface of the channel layer 132. The portion of the channel layer 132 in contact with the source electrode 173 and the drain electrode 175 may be doped with high concentration. At this time, the carrier passing through the 2-dimensional electron gas 134 may pass through the portion of the channel layer 132 doped at high concentration, that is, the upper part of the 2-dimensional electron gas 134, and be transmitted to the source electrode 173 and the drain electrode 175. The source electrode 173 and the drain electrode 175 may be not in directly contact with the 2-dimensional electron gas 134 in the horizontal direction. The horizontal direction may mean a direction parallel to the upper surface of the channel layer 132 or the barrier layer 136.

The source electrode 173 and the drain electrode 175 may include a conductive material. For example, the source electrode 173 and the drain electrode 175 may include a metal, a metal alloy, a conductive metal nitride, a metal silicide, a doped semiconductor material, a conductive metal oxide, or a conductive metal oxynitride. For example, the source electrode 173 and the drain electrode 175 may include titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonizationnitride (TiAlC—N), titanium aluminum carbide (TiAlC), titanium carbide (TIC), tantalum carbonizationnitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or combination thereof, but it is not limited thereto. The source electrode 173 and the drain electrode 175 may be made of a single layer or multiple layers. The source electrode 173 and the drain electrode 175 may be in ohmic contact with the channel layer 132. The region in contact with the source electrode 173 and the drain electrode 175 within the channel layer 132 may be doped at a relatively high concentration compared to other regions.

The source electrode 173 may include a first source electrode 173*a* and a second source electrode 173*b*. The second source electrode 173*b* may be positioned on the first source electrode 173*a*. The first source electrode 173*a* may be in directly contact with the channel layer 132 and be electrically connected to the channel layer 132. The second source electrode 173*b* may not be in direct contact with the channel layer 132, and may be electrically connected to the channel layer 132 through the first source electrode 173*a*.

The drain electrode 175 may include a first drain electrode 175*a* and a second drain electrode 175*b*. The second drain electrode 175*b* may be positioned on the first drain electrode 175*a*. The first drain electrode 175*a* may be in directly contact with the channel layer 132 and be electrically connected to the channel layer 132. The second drain electrode 175*b* may not be in direct contact with the channel layer 132, and may be electrically connected to the channel layer 132 through the first drain electrode 175*a*.

The first source electrode 173*a* and the first drain electrode 175*a* may be positioned on the first protection layer 140. The first source electrode 173*a* and the first drain electrode 175*a* may be positioned between the first protection layer 140 and the second protection layer 160. Trenches that penetrate the first protection layer 140 and the barrier layer 136 and recess the upper surface of the channel layer 132 may be positioned on both sides of the gate electrode 155 to be spaced apart from each other. The first source electrode 173*a* and the first drain electrode 175*a* may be positioned in the trench positioned on both sides of the gate electrode 155, respectively. The first source electrode 173*a* and the first drain electrode 175*a* may be formed to fill the trench. Within the trench, the first source electrode 173*a* and the first drain electrode 175*a* may be in contact with the channel layer 132 and the barrier layer 136. The channel layer 132 may form the bottom surface and sidewall of the trench, and the barrier layer 136 may form the sidewall of the trench. Accordingly, the first source electrode 173*a* and the first drain electrode 175*a* may contact the upper and side surfaces of the channel layer 132. Additionally, the first source electrode 173*a* and the first drain electrode 175*a* may be in contact with side surface of the barrier layer 136. That is, the first source electrode 173*a* and the first drain electrode 175*a* may cover the side surfaces of the channel layer 132 and the barrier layer 136.

The upper surface of the first source electrode 173*a* and the first drain electrode 175*a* may be protruded from the upper surface of the first protection layer 140. Additionally, at least one of the first source electrode 173*a* and the first drain electrode 175*a* may cover at least a portion of the upper surface of the first protection layer 140. The second protection layer 160 may be positioned on the first source electrode 173*a* and the first drain electrode 175*a*. At least a portion of the first source electrode 173*a* and the first drain electrode 175*a* may be covered by the second protection layer 160. At least a portion of the first source electrode 173*a* and the first drain electrode 175*a* may be in contact with the second lower protection layer 160*a* and may not be in contact with the second upper protection layer 160*b*.

The semiconductor device may further include a first field dispersion layer 177*a* positioned on the first protection layer 140. The first field dispersion layer 177*a* may be positioned between the source electrode 173 and the drain electrode 175. The first field dispersion layer 177*a* may overlap the gate electrode 155 in the vertical direction. The gate electrode 155 may be covered by the first field dispersion layer 177*a*. The first field dispersion layer 177*a* may be electrically connected to the source electrode 173. For example, the first field dispersion layer 177*a* may be connected to the first source electrode 173*a*. The first field dispersion layer 177*a* may include the same material as the first source electrode 173*a* and may be positioned in the same layer as the first source electrode 173*a*. The first field dispersion layer 177*a* may be formed simultaneously in the same process as the first source electrode 173*a*. The boundary between the first field dispersion layer 177*a* and the first source electrode 173*a* is not clear, and the first field dispersion layer 177*a* may be formed integrally with the first source electrode 173*a*. However, it is not limited to this, and the first field dispersion layer 177*a* may be a separate component from the first source electrode 173*a*. Additionally, the first field dispersion layer 177*a* may be positioned in a different layer from the first source electrode 173*a* and may be formed in a different process. In some cases, the first field dispersion layer 177*a* may be electrically connected to the gate electrode 155. For example, an opening that overlaps the gate electrode 155 may be formed in the first protection layer 140, and the first field dispersion layer 177*a* may be connected to the gate electrode 155 through the opening. At this time, the first field dispersion layer 177*a* may not be connected to the source electrode 173.

The first field dispersion layer 177*a* may serve to disperse the electric field concentrated around the gate electrode 155. In the gate off state, the 2-dimensional electron gas 134 with a very high concentration may be positioned in the portion of the channel layer 132 positioned between the gate electrode 155 and the source electrode 173 and the portion of the channel layer 132 positioned between the gate electrode 155 and the drain electrode 175. When an electric field is concentrated on the gate electrode 155 and the gate semiconductor layer 152, a leakage current may increase and a breakdown voltage may decrease. The semiconductor device includes the first field dispersion layer 177*a* and thus may disperse the electric field concentrated around the gate electrode 155. Accordingly, a leakage current may be reduced and a breakdown voltage may be increased.

The second source electrode 173*b* and the second drain electrode 175*b* may be positioned on the second protection layer 160. The opening that penetrates the second protection layer 160 may be positioned to overlap the first source electrode 173*a*, and the second source electrode 173*b* may be positioned within the opening. The second source electrode 173*b* may be formed to fill the opening. Within the opening, the second source electrode 173*b* may be in contact with the first source electrode 173*a*. The second source electrode 173*b* may be connected to the first source electrode 173*a* through opening. Another opening that penetrates the second protection layer 160 may be positioned to overlap the first drain electrode 175*a*, and the second drain electrode 175*b* may be positioned within the opening. The second drain electrode 175*b* may be formed to fill the opening. Within the opening, the second drain electrode 175*b* may be in contact with the first drain electrode 175*a*. The second drain electrode 175*b* may be connected to the first drain electrode 175*a* through the opening. The upper surface of the second source electrode 173*b* and the second drain electrode 175*b* may be protruded from the upper surface of the second protection layer 160. Additionally, at least one of the second source electrode 173*b* and the second drain electrode 175*b* may cover at least a portion of the upper surface of the second protection layer 160.

The opening filled with second source electrode 173*b* may overlap the trench filled with first source electrode 173*a*. However, it is not limited to this, and in some cases, the opening and trench may not overlap. The opening filled with second source electrode 173*b* may completely overlap the first source electrode 173*a*. However, it is not limited to this, and in some cases, at least a part of the opening filled with the second source electrode 173*b* may not overlap the first source electrode 173*a*. At this time, the second source electrode 173*b* may cover the side of the first source electrode 173*a* and may be in contact with the upper surface of the first protection layer 140. The width of the opening filled with the second source electrode 173*b* may be similar to the width of the trench filled with the first source electrode 173*a*. However, the relationship between the width of the opening and the width of the trench is not limited to this and may be changed in various ways.

The opening filled with second drain electrode 175*b* may overlap the trench filled with first drain electrode 175*a*. However, it is not limited to this, and in some cases, the opening and trench may not overlap. The opening filled with second drain electrode 175*b* may completely overlap the first drain electrode 175*a*. However, it is not limited to this, and in some cases, at least a portion of the opening filled with the second drain electrode 175*b* may not overlap the first drain electrode 175*a*. At this time, the second drain electrode 175*b* may cover the side of the first drain electrode 175*a* and may be in contact with the upper surface of the first protection layer 140. The width of the opening filled with the second drain electrode 175*b* may be similar to the width of the trench filled with the first drain electrode 175*a*. However, the relationship between the width of the opening and the width of the trench is not limited to this and may be changed in various ways.

The semiconductor device may further include a second field dispersion layer 177*b* positioned on the second protection layer 160. The second field dispersion layer 177*b* may be positioned between the source electrode 173 and the drain electrode 175. The second field dispersion layer 177*b* may overlap the gate electrode 155 in the vertical direction. The second field dispersion layer 177*b* may overlap the first field dispersion layer 177*a* in the vertical direction. The gate electrode 155 and the first field dispersion layer 177*a* may be covered by the second field dispersion layer 177*b*. The second field dispersion layer 177*b* may be wider than the first field dispersion layer 177*a*. The second field dispersion layer 177*b* may entirely cover the first field dispersion layer 177*a*. However, it is not limited to this, and the width and the position relationship of the first field dispersion layer 177*a* and the second field dispersion layer 177*b* may be changed in various ways. The second field dispersion layer 177*b* may be electrically connected to the source electrode 173. For example, the second field dispersion layer 177*b* may be connected to the second source electrode 173*b*. The second field dispersion layer 177*b* may include the same material as the second source electrode 173*b* and may be positioned in the same layer as the second source electrode 173*b*. The second field dispersion layer 177*b* may be formed simultaneously in the same process as the second source electrode 173*b*. The boundary between the second field dispersion layer 177*b* and the second source electrode 173*b* is not clear, and the second field dispersion layer 177*b* may be formed integrally with the second source electrode 173*b*. However, it is not limited to this, and the second field dispersion layer 177*b* may be a separate component from the second source electrode 173*b*. Additionally, the second field dispersion layer 177*b* may be positioned in a different layer and may be formed in a different process from the second source electrode 173*b*. In some cases, the second field dispersion layer 177*b* may be electrically connected to the gate electrode 155. For example, the first field dispersion layer 177*a* may be connected to the gate electrode 155 through an opening formed in the first protection layer 140, and the second field dispersion layer 177*b* may be connected to the first field dispersion layer 177*a* through an opening formed in the second protection layer 160.

In some cases, at least one of field dispersion layers 177*a* and 177*bs* may be omitted. For example, the semiconductor device may include the first field dispersion layer 177*a* and do not include the second field dispersion layer 177*b*. Alternatively, the semiconductor device may include the second field dispersion layer 177*b* and do not include the first field dispersion layer 177*a*. Alternatively, the semiconductor device may do not include the first field dispersion layer 177*a* and the second field dispersion layer 177*b*.

The semiconductor device may further include a capping layer 190 positioned on the source electrode 173 and the drain electrode 175. At least a portion of the upper surface and side surfaces of the second source electrode 173*b* and the second drain electrode 175*b* may be covered by the capping layer 190. The second field dispersion layer 177*b* may be covered by the capping layer 190. The capping layer 190 is intended to protect the semiconductor device from external stress, such as moisture or oxygen, and may be positioned on the uppermost layer of the semiconductor device. That is, the capping layer 190 may be positioned on the outermost side of the semiconductor device. The source electrode 173 and drain electrode 175 may be connected to an external wire, and the capping layer 190 may include pad opened parts 191 and 193 for a connection to the wire. A first pad opened part 191 that overlaps at least a portion of the source electrode 173 may be formed in the capping layer 190. The upper surface of the source electrode 173 may be exposed to the outside by first pad opened part 191. Although not shown, a wire electrically connected to the source electrode 173 through the first pad opened part 191 may be further formed. A second pad opened part 193 that overlaps at least a portion of the drain electrode 175 may be formed in the capping layer 190. The upper surface of the drain electrode 175 may be exposed to the outside by the second pad opened part 193. Although not shown, a wire electrically connected to the drain electrode 175 through the second pad opened part 193 may be further formed.

The capping layer 190 may include an insulating material. For example, the capping layer 190 may include materials such as polyimide (PI, polyimide), fluorinated polyimides (FPI), SiO2, SiN, SiON, etc. Most materials such as polyimide can have functional groups including F. The capping layer 190 may include components with high electron affinity, such as F, Cl, etc., and F ions, Cl ions, etc. may diffuse from the capping layer 190 to the surroundings. The electron affinity of F is about 328.2 kJ/mol, and the electron affinity of Cl is about 348.6 kJ/mol. When the diffused F ions, Cl ions, etc. move into the channel layer 132, the density of the 2-dimensional electron gas 134 formed within the channel layer 132 may be reduced. Accordingly, if the flow of 2-dimensional electron gas 134 is disconnected, a current may not flow properly and a channel may not be formed. That is, degradation may occur, such as a decrease in the on current (Id) formed in the channel in the gate on, and an increase in the on-resistance (Ron) of the semiconductor device.

The capping layer 190 may be composed of a single layer or multiple layers. The capping layer 190 is positioned on the outermost layer to physically and chemically protect the inside of the device from the outside, and may be formed much thicker than other layers of the semiconductor device. For example, when the capping layer 190 includes polyimide, the thickness of the capping layer 190 may be about 5 μm or more. In some cases, the thickness of the capping layer 190 may be less than about 5 μm. For example, when the capping layer 190 is made of a bilayer of $SiO_2$, SiN, SiON, $SiO_2$, the thickness of the capping layer 190 may be less than about 3 μm. However, the thickness of the capping layer 190 is not limited to this and may be changed in various ways. For example, if the capping layer 190 is made of a material with very high strength, it may be formed thinner.

The diffusion barrier layer 500 may be positioned within the protection layers 140 and 160. The diffusion barrier layer 500 may be positioned within the second protection layer 160. The diffusion barrier layer 500 may be positioned between the second lower protection layer 160*a* and the second upper protection layer 160*b*. The bottom surface of the diffusion barrier layer 500 may be in contact with the second lower protection layer 160*a*, and the upper surface of the diffusion barrier layer 500 may be in contact with the second upper protection layer 160*b*. However, it is not limited to this, and another predetermined layer may be positioned between the diffusion barrier layer 500 and the second lower protection layer 160*a* or between the diffusion barrier layer 500 and the second upper protection layer 160*b*. The diffusion barrier layer 500 may be positioned approximately in the middle of the second protection layer 160. The second lower protection layer 160*a* and the second upper protection layer 160*b* may be separated from each other by the diffusion barrier layer 500, and the thickness of the second lower protection layer 160*a* and the thickness of the second upper protection layer 160*b* may be similar. However, the position of the diffusion barrier layer 500 is not limited to this and may be changed in various ways. For example, the diffusion barrier layer 500 may be positioned at the approximately lower part within second protection layer 160. At this time, the thickness of the second lower protection layer 160*a* may be relatively thinner than the thickness of the second upper protection layer 160*b*. In other cases, the diffusion barrier layer 500 may be positioned on the approximately upper part of the second protection layer 160. At this time, the thickness of the second lower protection layer 160*a* may be relatively thick compared to the thickness of the second upper protection layer 160*b*.

The thickness of the diffusion barrier layer 500 may be thinner than the thickness of the second protection layer 160. For example, when the sum of the second lower protection layer 160*a* and the second upper protection layer 160*b* is about 16,000 Å, the thickness of diffusion barrier layer 500 may be about 500 Å or more and about 5000 Å or less. That is, the thickness of the diffusion barrier layer 500 may be between about 1/30 to about 1/3 of the sum of the thicknesses of the second lower protection layer 160*a* and the second upper protection layer 160*b*.

The diffusion barrier layer 500 may be positioned on the channel layer 132, the barrier layer 136, and the gate electrode 155. The channel layer 132, the barrier layer 136, and the gate electrode 155 may be covered by the diffusion barrier layer 500. The diffusion barrier layer 500 may overlap the channel layer 132, the barrier layer 136, and the gate electrode 155 in the vertical direction. Particularly, the diffusion barrier layer 500 may overlap the drift region DTR of the channel layer 132 in the vertical direction. It is shown that the diffusion barrier layer 500 overlaps most of the channel layer 132, but it is not limited thereto. The diffusion barrier layer 500 may overlap the drift region DTR of the channel layer 132, but may not overlap the remaining regions.

The diffusion barrier layer 500 may be penetrated by the source electrode 173 and the drain electrode 175. The second source electrode 173*b* may penetrate the diffusion barrier layer 500 and be connected to the first source electrode 173*a*. The second drain electrode 175*b* may be connected to the first drain electrode 175*a* by penetrating the diffusion barrier layer 500. Therefore, the diffusion barrier layer 500 may not overlap at least a portion of the source electrode 173 and the drain electrode 175 in the vertical direction. The second source electrode 173*b* and the second drain electrode 175*b* may be in contact with the side of the diffusion barrier layer 500. Looking at the position where the second source electrode 173*b* and the diffusion barrier layer 500 are in contact, one side of the second source electrode 173*b*, for example, the portion of the diffusion barrier layer 500 that is in contact with the left side in the drawing may be positioned at the lower level than the other side of the second source electrode 173*b*, for example, the portion of the diffusion barrier layer 500 that is in contact with the right side in the drawing. That is, the portion of the diffusion barrier layer 500 in contact with one side of the second source electrode 173*b* may be positioned at a different level from the portion of the diffusion barrier layer 500 in contact with the other side of the second source electrode 173*b*. Looking at the position where the second drain electrode 175*b* and the diffusion barrier layer 500 are in contact, the portion of the diffusion barrier layer 500 in contact with one side of the second drain electrode 175*b* may be positioned at a level substantially equivalent to the portion of the diffusion barrier layer 500 in contact with the other side of the second drain electrode 175*b*. Additionally, looking at the portion of the diffusion barrier layer 500 positioned between the second source electrode 173*b* and the second drain electrode 175*b*, the portion of the diffusion barrier layer 500 in contact with the second source electrode 173*b* may be positioned at a higher level than the portion of the diffusion barrier layer 500 in contact with the second drain electrode 175*b*. That is, the portion of the diffusion barrier layer 500 in contact with the second source electrode 173*b* may be positioned at a different level from the portion of the diffusion barrier layer 500 in contact with the second drain electrode 175*b*. However, this is only an example, and the positions where the source electrode 173 and the drain electrode 175 are in contact with the diffusion barrier layer 500 may be changed in various ways.

The diffusion barrier layer 500 may be positioned below the capping layer 190. The diffusion barrier layer 500 may be covered by the capping layer 190. The diffusion barrier layer 500 may be positioned between the channel layer 132 and the capping layer 190. The diffusion barrier layer 500 may be positioned between the drift region DTR, where the 2-dimensional electron gas 134 is generated in the channel layer 132 and the capping layer 190. The diffusion barrier layer 500 may be positioned between the barrier layer 136 and the capping layer 190. The diffusion barrier layer 500 may be positioned between the portion of the barrier layer 136 that overlaps the drift region DTR, and the capping layer 190.

The diffusion barrier layer 500 may include an insulating material. The diffusion barrier layer 500 may be made of an insulating material containing Nitrogen. For example, the diffusion barrier layer 500 may include materials such as SiN, SiON, SiOCN, AlN, etc. The diffusion barrier layer 500 may prevent predetermined materials from being diffused to the surroundings. The diffusion barrier layer 500 may prevent F ions and Cl ions diffused from the capping layer 190 from moving into the channel layer 132. Therefore, a decrease in the density of the 2-dimensional electron gas 134 formed in the channel layer 132 may be prevented, and characteristic degradations such as an on-current and an on-resistance may be prevented. In addition, the diffusion barrier layer 500 may prevent moisture or oxygen from being penetrated into the channel layer 132. In other words, the semiconductor device may have stable electric characteristics and a reliability may be improved.

Below, characteristics of a semiconductor device and a semiconductor device according to a reference example will be compared and described with reference to FIG. 3 and FIG. 4.

Figure 3:
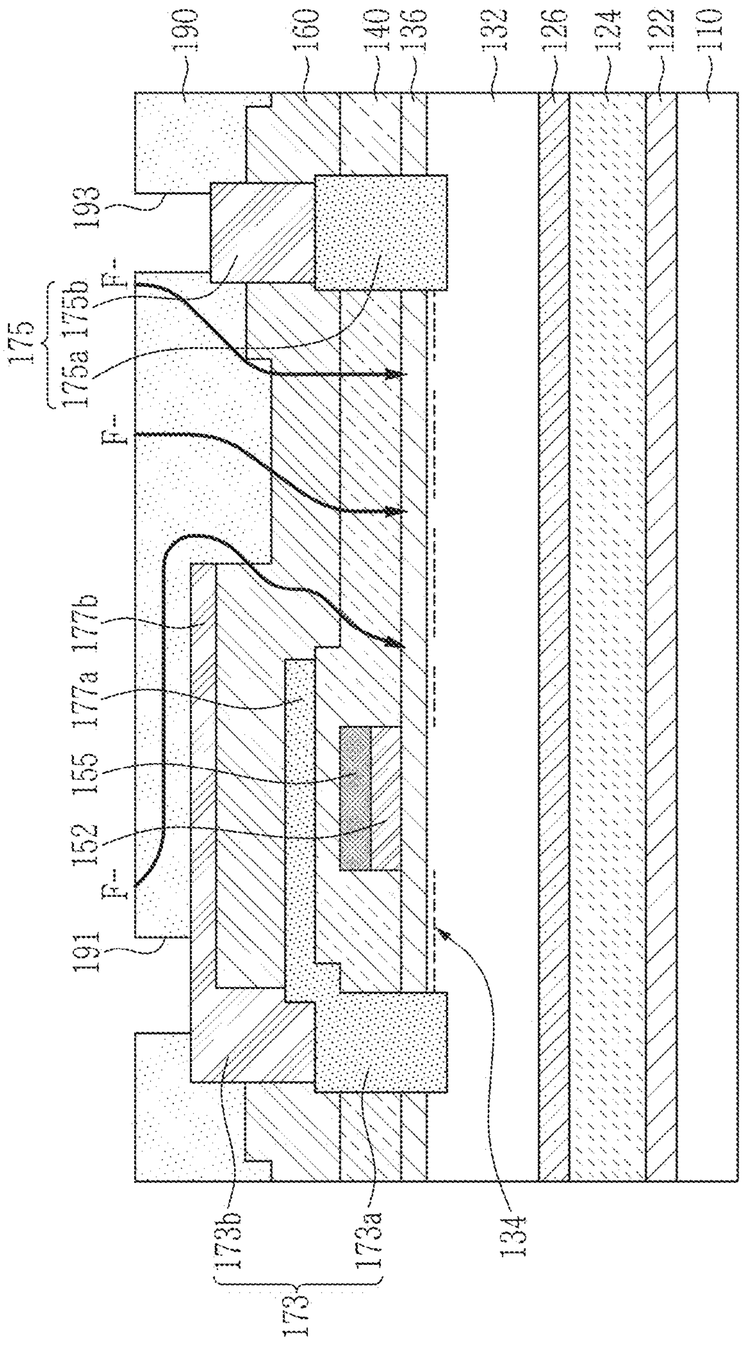
FIG. 3 is a view showing a movement path of ions within an example of a semiconductor device.

FIG. 3 is a view showing a movement path of ions within an example of a semiconductor device. FIG. 4 is a view showing a movement path of ions within an example of a semiconductor device.

As shown in FIG. 3, a semiconductor device according to a reference example may include a channel layer 132, a barrier layer 136 positioned on the channel layer 132, a gate electrode 155 positioned on the barrier layer 136, a gate semiconductor layer 152 positioned between the barrier layer 136 and the gate electrode 155, a source electrode 173 and a drain electrode 175 separated from each other on the channel layer 132, a protection layer 140 and 160 positioned on the barrier layer 136 and the gate electrode 155, and a capping layer 190 positioned on the source electrode 173, the drain electrode 175, and the protection layer 140, and 160. The semiconductor device according to the reference example does not have a separate diffusion barrier layer within the protection layers 140 and 160.

The capping layer 190 may include polyimide including F, and F ions (F—) may be diffused from the capping layer 190 and move to the lower part of the capping layer 190. F ion (F—) diffused from the capping layer 190 may pass through the second protection layer 160 and the first protection layer 140 and reach the barrier layer 136 and the channel layer 132. At this time, F ion (F—) may not pass through the source electrode 173 or drain electrode 175. When these F ions (F—) reach the channel layer 132, the density of the 2-dimensional electron gas 134 formed in the channel layer 132 may be reduced. Accordingly, if the flow of the 2-dimensional electron gas 134 is interrupted, a current may not flow properly and a channel may not be formed, which may degrade the performance of the semiconductor device according to the reference example.

Figure 4:
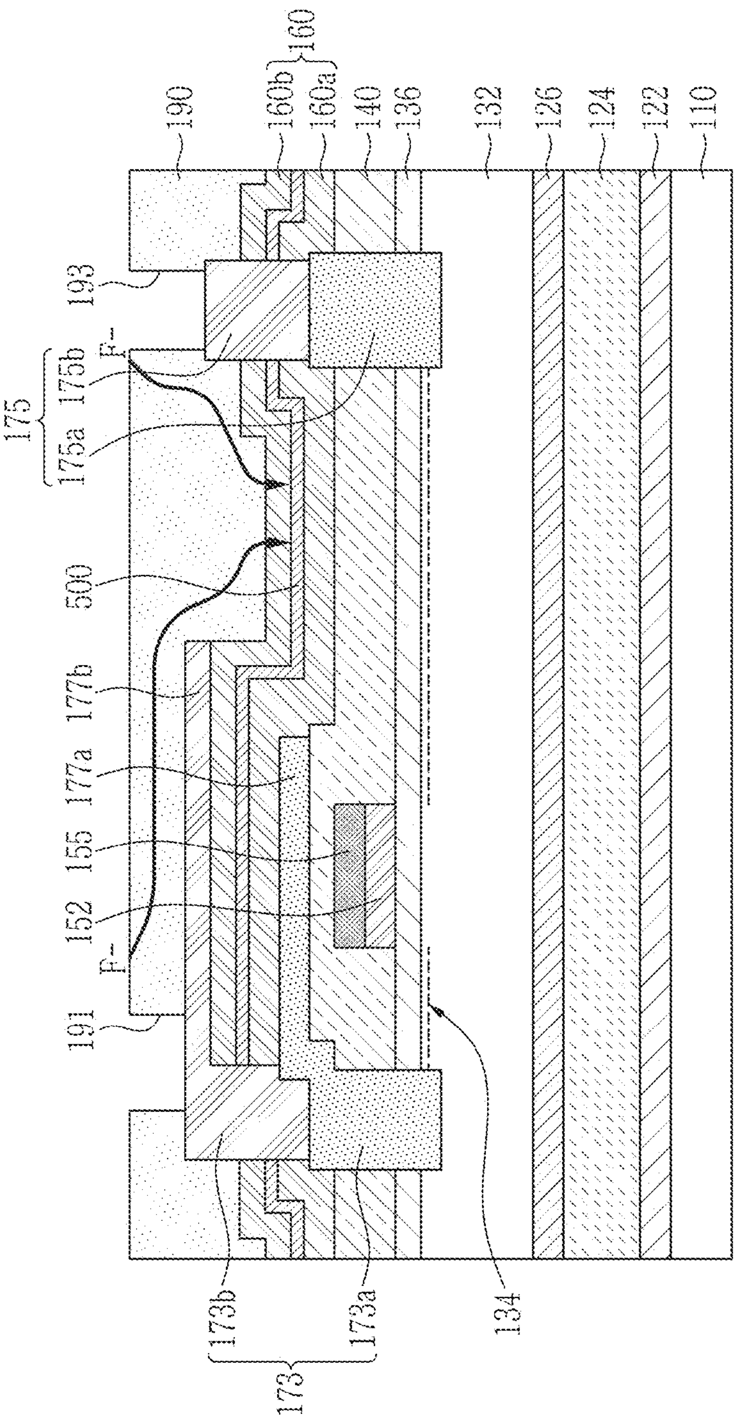
FIG. 4 is a view showing a movement path of ions within an example of a semiconductor device.

As shown in FIG. 4, the semiconductor device may include a diffusion barrier layer 500 positioned within the protection layer 140 and 160. The diffusion barrier layer 500 may be positioned between the channel layer 132 and the capping layer 190. The diffusion barrier layer 500 may be positioned between the barrier layer 136 and the capping layer 190. The diffusion barrier layer 500 may be positioned between the source electrode 173 and the drain electrode 175. The diffusion barrier layer 500 may overlap the drift region DTR of the channel layer 132.

F ion (F—) diffused from the capping layer 190 may pass through the second upper protection layer **160*b* and reach the diffusion barrier layer 500. F ion (F—) may not pass through the diffusion barrier layer 500. The semiconductor device includes the diffusion barrier layer 500, thereby preventing F ions (F—) diffused from the capping layer 190 from passing through the protection layers 140 and 160. Therefore, it is possible to prevent F ions (F—) diffused from the capping layer 190 from reaching the barrier layer 136 or the channel layer 132. Accordingly, a decrease in the density of the 2-dimensional electron gas 134 formed in the channel layer 132 may be prevented, and the characteristics of the semiconductor device may be improved. In addition, the diffusion barrier layer 500** may prevent moisture, oxygen, etc. from penetrating into the interior of the semiconductor device. In other words, the semiconductor device may have stable electric characteristics and a reliability can be improved. Compared to the semiconductor device according to the reference example, the on-current of the semiconductor device may increase and the on-resistance may decrease. Particularly, in the high temperature reverse bias (HTRB) quality test, the semiconductor device showed an improvement of about 10% to about 30% or more compared to the semiconductor device according to the reference example.

Next, the semiconductor device according to an implementation is described with reference to FIG. 5 to FIG. 11B.

FIG. 5 to FIG. 11B are example cross-sectional views showing a semiconductor device.

FIG. 5 to FIG. 11B show numerous exemplary variations of the semiconductor device shown in FIG. 1. The implementation shown in FIG. 5 to FIG. 11B includes many parts that are the same as the implementation shown in FIG. 1 so that the description thereof is omitted and difference are mainly described. Additionally, the same reference numerals are used for the same components as the previous implementation. In the implementation shown in FIG. 5 to FIG. 11B, the position, the like of the diffusion barrier layer may be slightly different from the previous implementation.

Figure 5:
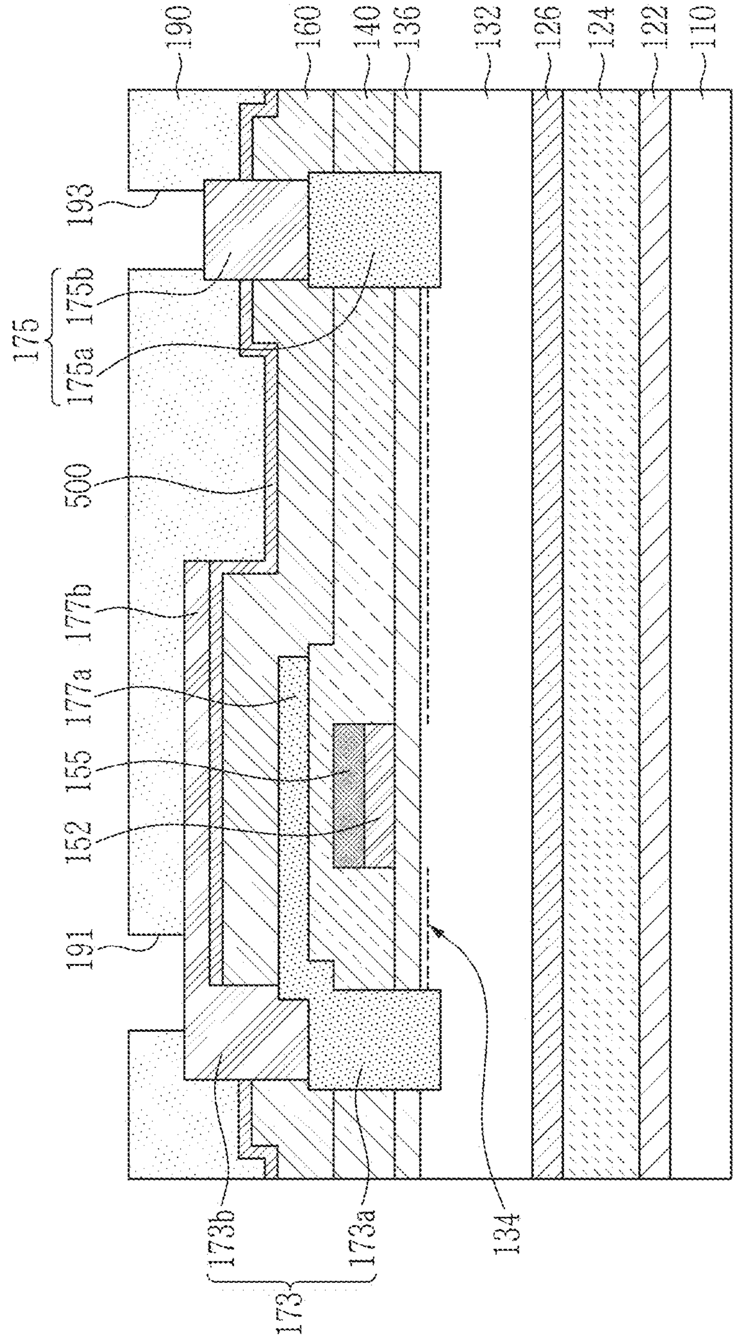
FIG. 5 to FIG. 11B are example cross-sectional views showing a semiconductor device.

As shown in FIG. 5, a semiconductor device includes a channel layer 132, a barrier layer 136 positioned on the channel layer 132, a gate electrode 155 positioned on the barrier layer 136, a gate semiconductor layer 152 positioned between the barrier layer 136 and the gate electrode 155, a source electrode 173 and a drain electrode 175 separated from each other on the channel layer 132, a protection layer 140 and 160 positioned on the barrier layer 136 and the gate electrode 155, and a diffusion barrier layer 500 positioned on the protection layer 140 and 160.

The semiconductor device may further include a capping layer 190 positioned on the diffusion barrier layer 500. The diffusion barrier layer 500 may be positioned between the protection layers 140 and 160 and the capping layer 190. The protection layers 140 and 160 may include a first protection layer 140, and a second protection layer 160 positioned on the first protection layer 140. The diffusion barrier layer 500 may be positioned between the second protection layer 160 and the capping layer 190. The bottom surface of the diffusion barrier layer 500 may be in contact with the second protection layer 160. The upper surface of the diffusion barrier layer 500 may be in contact with the capping layer 190. The semiconductor device may further include a second field dispersion layer **177*b* connected to the second source electrode 173*b*, and the upper surface of the diffusion barrier layer 500 may be in further contact with the second field dispersion layer 177*b*. However, it is not limited to this, and other layers may be positioned between the diffusion barrier layer 500 and the second protection layer 160, and between the diffusion barrier layer 500 and the capping layer 190**.

The material diffused from the capping layer 190 may be blocked from moving by the diffusion barrier layer 500. Accordingly, the material diffused from the capping layer 190 may be prevented from reaching the barrier layer 136 and the channel layer 132, and the characteristics of the semiconductor device may be improved.

Figure 6:
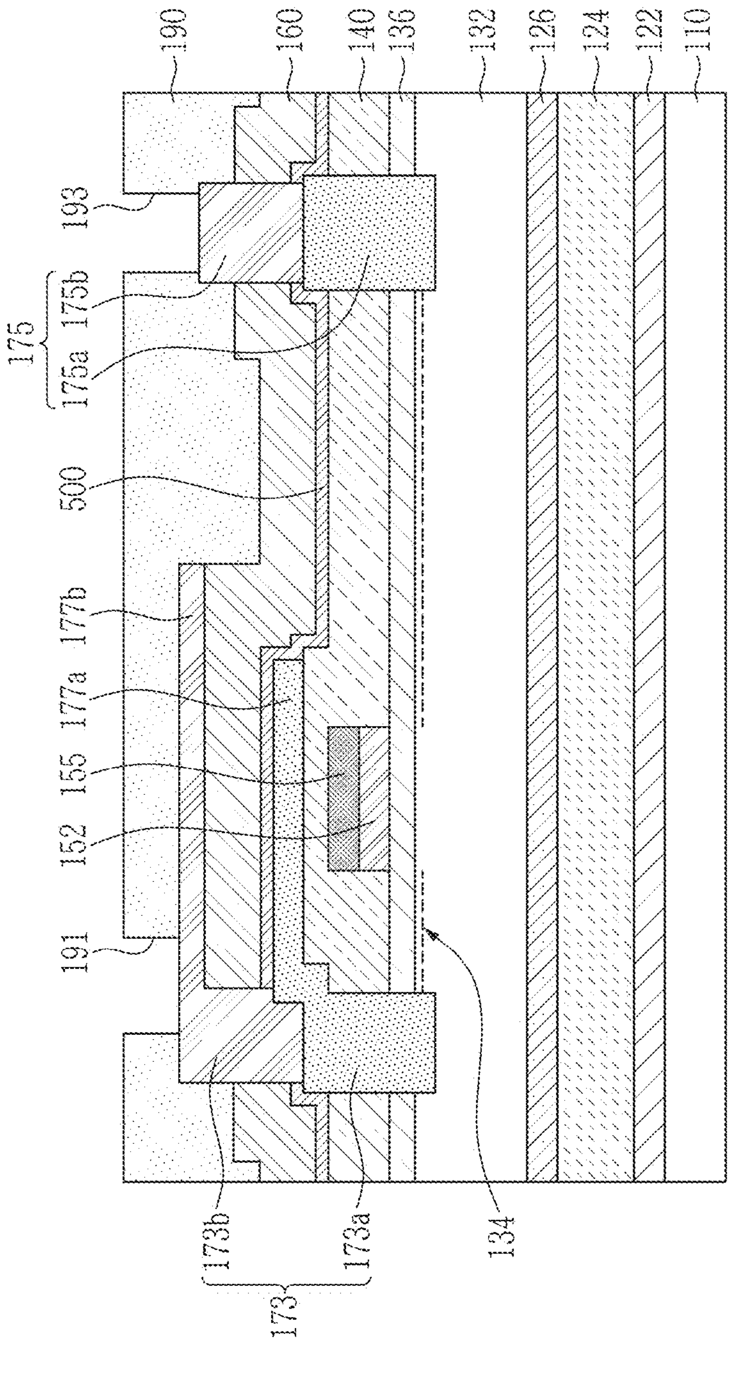

As shown in FIG. 6, the diffusion barrier layer 500 may be positioned between the first protection layer 140 and the second protection layer 160. The bottom surface of the diffusion barrier layer 500 may be in contact with the first protection layer 140. The bottom surface of the diffusion barrier layer 500 may be further in contact with the first source electrode 173*a*, the first field dispersion layer 177*a*, and the first drain electrode 175*a*. The diffusion barrier layer 500 may cover the upper and side surfaces of the first field dispersion layer 177*a*. At this time, the diffusion barrier layer 500 may contact the upper and side surfaces of the first field dispersion layer 177*a*. The side of the diffusion barrier layer 500 may be in contact with the second source electrode 173*b* and the second drain electrode 175*b*. The upper surface of the diffusion barrier layer 500 may be in contact with the second protection layer 160. However, it is not limited to this, and other layers may be positioned between diffusion barrier layer 500 and first protection layer 140, and between diffusion barrier layer 500 and second protection layer 160. The semiconductor device includes a diffusion barrier layer 500, thereby preventing materials diffused from the capping layer 190 from reaching the channel layer 132, which may improve device characteristics.

Figure 7:
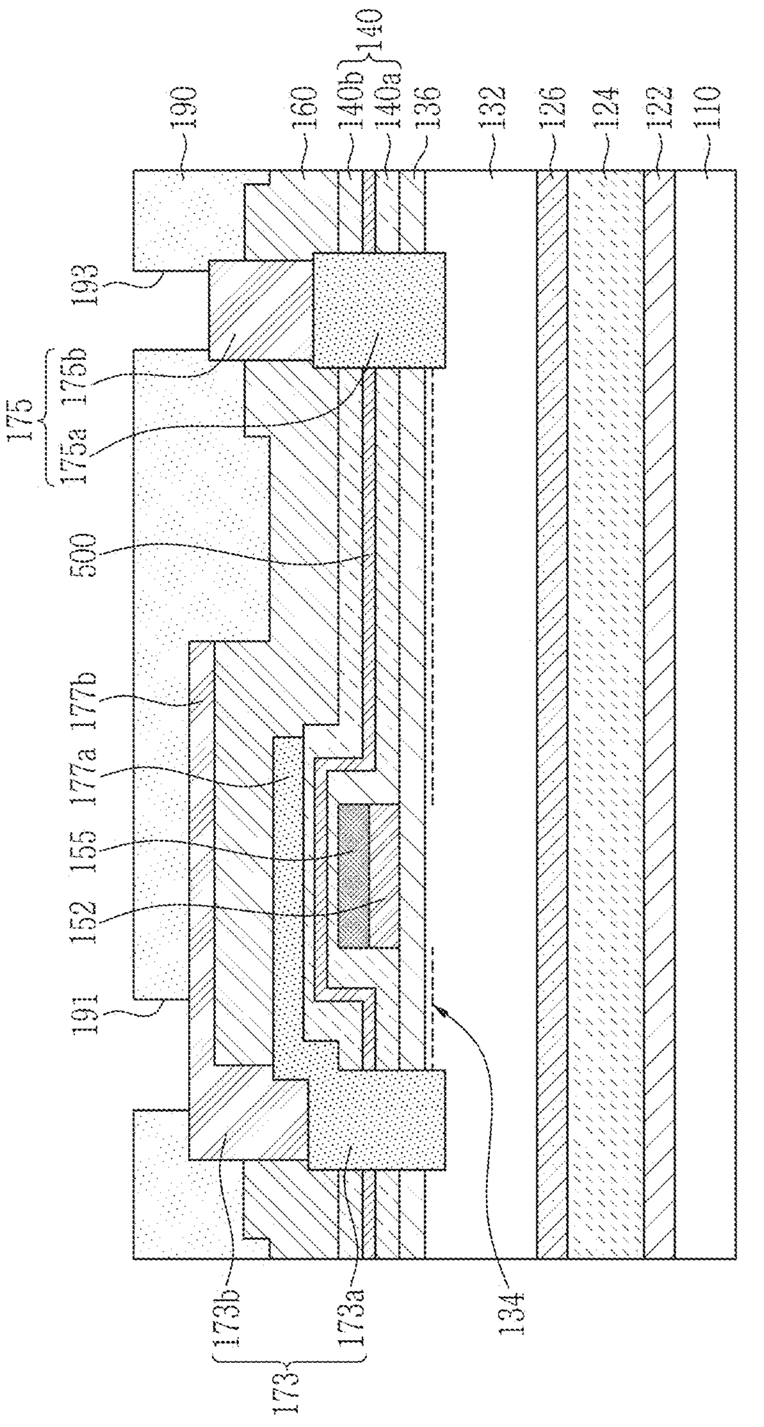

As shown in FIG. 7, the diffusion barrier layer 500 may be positioned within the first protection layer 140. The first protection layer 140 may include a first lower protection layer 140*a* and a first upper protection layer 140*b*. The diffusion barrier layer 500 may be positioned between the first lower protection layer 140*a* and the first upper protection layer 140*b*. The bottom surface of the diffusion barrier layer 500 may be in contact with the first lower protection layer 140*a*, and the upper surface of the diffusion barrier layer 500 may be in contact with the first upper protection layer 140*b*. However, it is not limited to this, and other layers may be positioned between the diffusion barrier layer 500 and the first lower protection layer 140*a*, and between the diffusion barrier layer 500 and the first upper protection layer 140*b*. The side of the diffusion barrier layer 500 may be in contact with the first source electrode 173*a* and the first drain electrode 175*a*. By preventing the material diffused from the capping layer 190 from reaching the channel layer 132 by the diffusion barrier layer 500, the characteristics of the semiconductor device may be improved.

Figure 8:
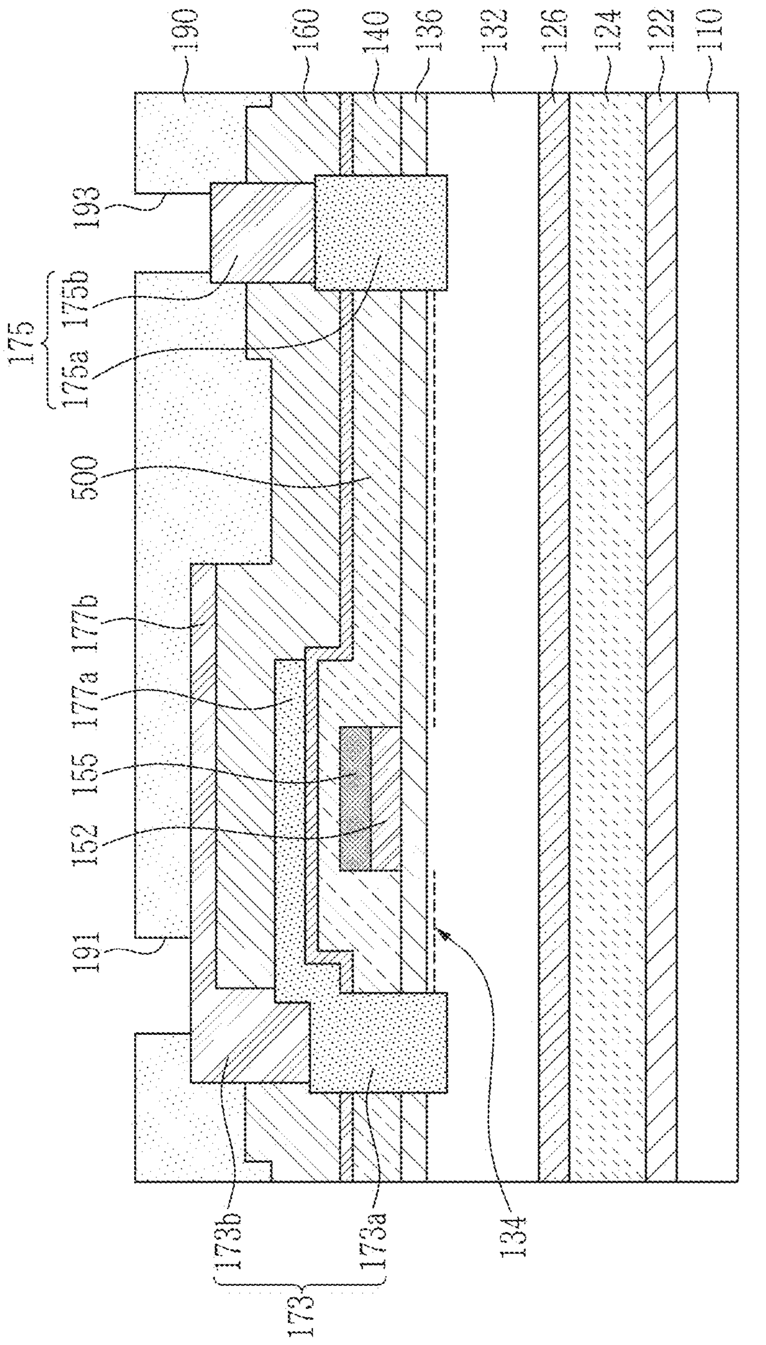

As shown in FIG. 8, the diffusion barrier layer 500 may be positioned between the first protection layer 140 and the second protection layer 160. The bottom surface of the diffusion barrier layer 500 may be in contact with the first protection layer 140. The upper surface of the diffusion barrier layer 500 may be in contact with the second protection layer 160. The upper surface of the diffusion barrier layer 500 may be in contact with the first source electrode 173*a* and the first field dispersion layer 177*a*. In some cases, the first drain electrode 175*a* may be formed to cover at least a portion of the upper surface of the diffusion barrier layer 500, and in this case, the upper surface of the diffusion barrier layer 500 may be in contact with the first drain electrode 175*a*. The side of the diffusion barrier layer 500 may be in contact with the first source electrode 173*a* and the first drain electrode 175*a*. However, it is not limited to this, and other layers may be positioned between the diffusion barrier layer 500 and the first protection layer 140, and between the diffusion barrier layer 500 and the second protection layer 160. The semiconductor device includes the diffusion barrier layer 500, thereby preventing materials diffused from the capping layer 190 from reaching the channel layer 132, thereby improving device characteristics.

Figure 9:
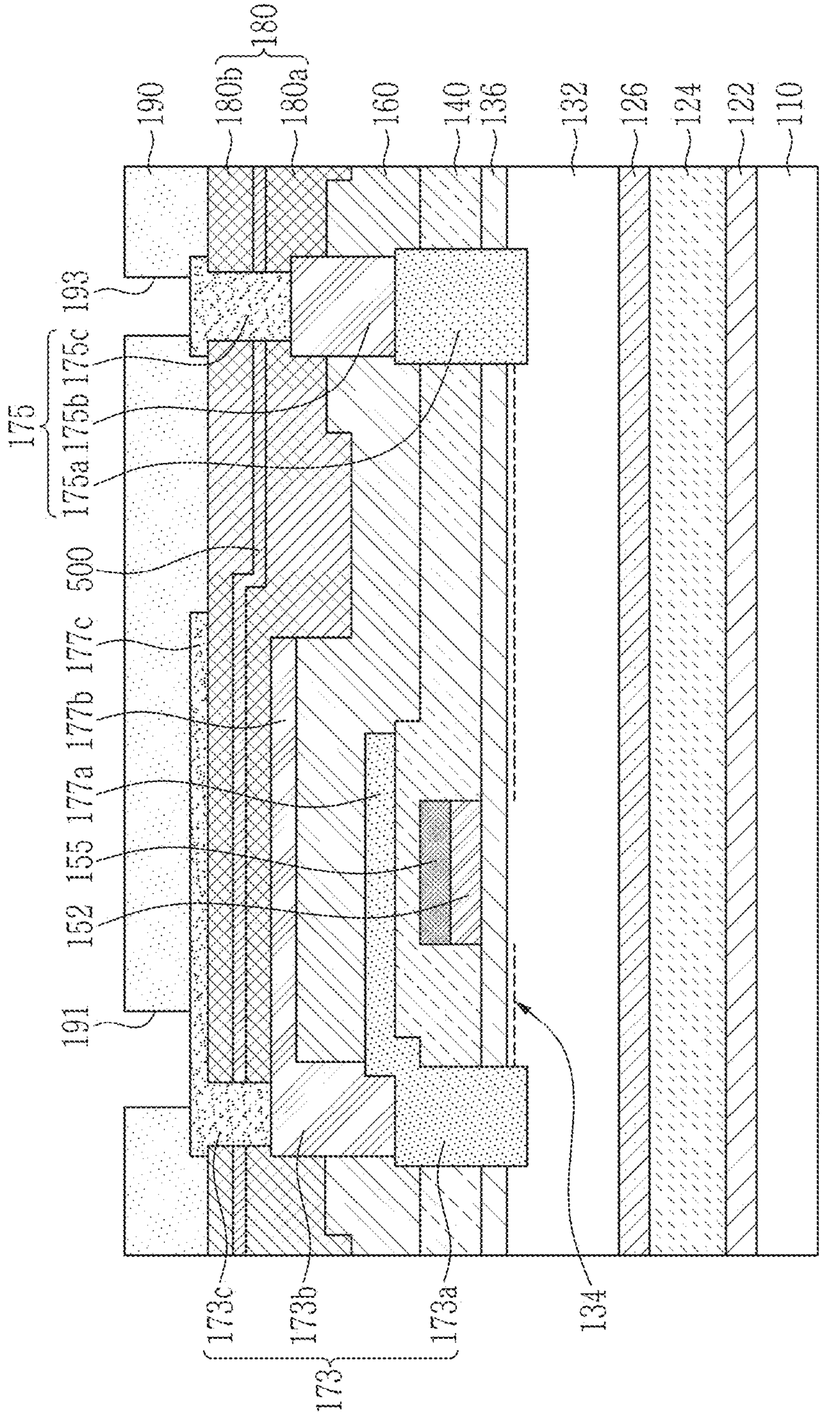

As shown in FIG. 9, a semiconductor device includes a channel layer 132, a barrier layer 136 positioned on the channel layer 132, a gate electrode 155 positioned the barrier layer 136, a gate semiconductor layer 152 positioned between the barrier layer 136 and the gate electrode 155, a source electrode 173 and a drain electrode 175 separated from each other on the channel layer 132, a protection layer 140, 160, and 180 positioned on the barrier layer 136 and the gate electrode 155, and a diffusion barrier layer 500 positioned within the protection layer 140, 160, and 180.

The source electrode 173 may include a first source electrode 173*a*, a second source electrode 173*b*, and a third source electrode 173*c*. The second source electrode 173*b* may be positioned on the first source electrode 173*a*, and the third source electrode 173*c* may be positioned on the second source electrode 173*b*. The first source electrode 173*a* may be connected to the channel layer 132, the second source electrode 173*b* may be connected to the first source electrode 173*a*, and the third source electrode 173*c* may be connected to the second source electrode 173*b*.

The semiconductor device may further include a first field dispersion layer 177*a*, a second field dispersion layer 177*b*, and a third field dispersion layer 177*c*. The first field dispersion layer 177*a* may be connected to the first source electrode 173*a* and may be integrated with the first source electrode 173*a*. The second field dispersion layer 177*b* may be connected to the second source electrode 173*b* and may be integrated with the second source electrode 173*b*. The third field dispersion layer 177*c* may be connected to the third source electrode 173*c* and may be integrated with the third source electrode 173*c*.

The drain electrode 175 may include a first drain electrode 175*a*, a second drain electrode 175*b*, and a third drain electrode 175*c*. The second drain electrode 175*b* may be positioned on the first drain electrode 175*a*, and the third drain electrode 175*c* may be positioned on the second drain electrode 175*b*. The first drain electrode 175*a* may be connected to the channel layer 132, the second drain electrode 175*b* may be connected to the first drain electrode 175*a*, and the third drain electrode 175*c* may be connected to the second drain electrode 175*b*.

The protection layers 140, 160, and 180 may include a first protection layer 140, a second protection layer 160, and a third protection layer 180. The first protection layer 140 may be positioned on the barrier layer 136 and the gate electrode 155. The first protection layer 140 may be positioned between the gate electrode 155 and the first field dispersion layer 177*a*. The first source electrode 173*a* may penetrate the first protection layer 140 and be connected to the channel layer 132. The first drain electrode 175*a* may penetrate the first protection layer 140 and be connected to the channel layer 132.

The second protection layer 160 may be positioned on the first source electrode 173*a* and the first drain electrode 175*a*. The second protection layer 160 may be positioned between the first field dispersion layer 177*a* and the second field dispersion layer 177*b*. The second source electrode 173*b* may penetrate the second protection layer 160 and be connected to the first source electrode 173*a*. The second drain electrode 175*b* may penetrate the second protection layer 160 and be connected to the first drain electrode 175*a*.

The third protection layer 180 may be positioned on the second source electrode 173*b* and the second drain electrode 175*b*. The third protection layer 180 can be positioned between the second field dispersion layer 177*b* and the third field dispersion layer 177*c*. The third source electrode 173*c* may penetrate the third protection layer 180 and be connected to the second source electrode 173*b*. The third drain electrode 175*c* may penetrate the third protection layer 180 and be connected to the second drain electrode 175*b*.

The third protection layer 180 may include a third lower protection layer 180*a* and a third upper protection layer

180*b*. The third upper protection layer 180*b* may be positioned on the third lower protection layer 180*a*. The diffusion barrier layer 500 may be positioned between the third lower protection layer 180*a* and the third upper protection layer 180*b*. The bottom surface of the diffusion barrier layer 500 may be in contact with the third lower protection layer 180*a*, and the upper surface of the diffusion barrier layer 500 may be in contact with the third upper protection layer 180*b*. However, it is not limited to this, and other layers may be positioned between diffusion barrier layer 500 and the third lower protection layer 180*a*, and between diffusion barrier layer 500 and third upper protection layer 180*b*. Additionally, the diffusion barrier layer 500 may be positioned within the first protection layer 140 and/or the second protection layer 160 instead of the third protection layer 180. The semiconductor device includes the diffusion barrier layer 500, thereby preventing materials diffused from the capping layer 190 from reaching the channel layer 132, thereby improving device characteristics.

Figure 10:
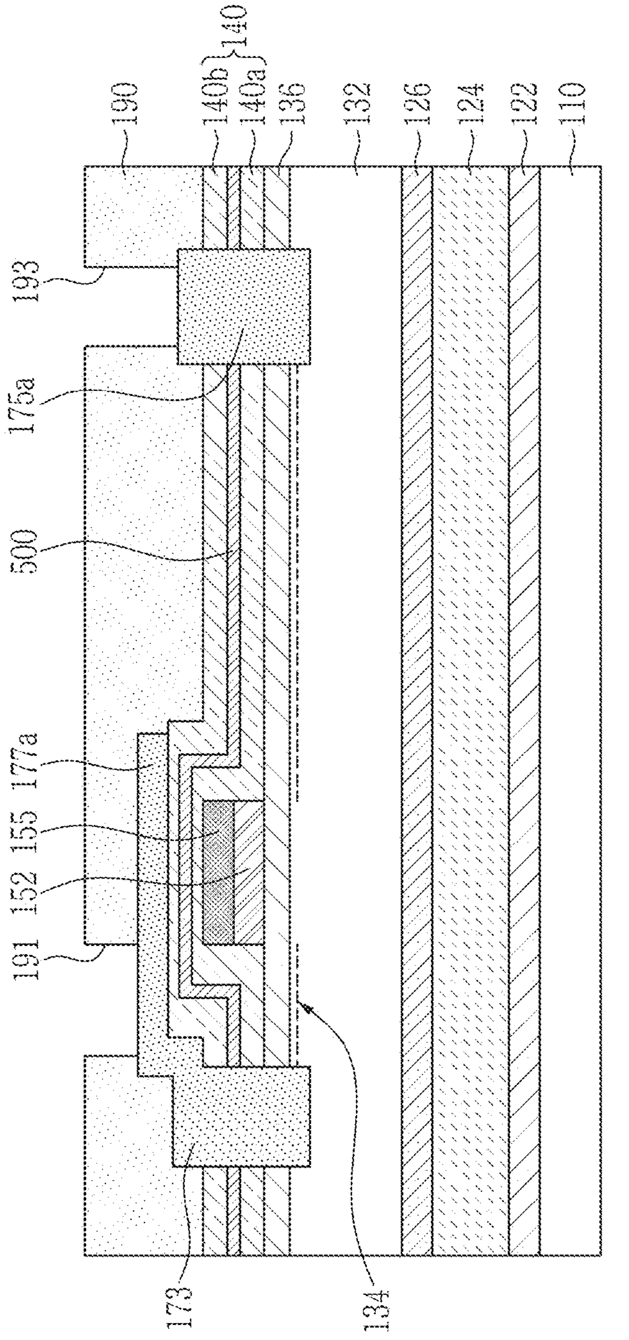

As shown in FIG. 10, a semiconductor device includes a channel layer 132, a barrier layer 136 positioned on the channel layer 132, a gate electrode 155 positioned the barrier layer 136, a gate semiconductor layer 152 positioned between the barrier layer 136 and the gate electrode 155, a source electrode 173 and a drain electrode 175 separated from each other on the channel layer 132, a first protection layer 140 positioned on the barrier layer 136 and the gate electrode 155, and a diffusion barrier layer 500 positioned within the first protection layer 140.

The first protection layer 140 may include a first lower protection layer 140*a* and a first upper protection layer 140*b*. The diffusion barrier layer 500 may be positioned between the first lower protection layer 140*a* and the first upper protection layer 140*b*. The bottom surface of the diffusion barrier layer 500 may be in contact with the first lower protection layer 140*a*. The upper surface of the diffusion barrier layer 500 may be in contact with the first upper protection layer 140*b*. However, it is not limited to this, and other layers may be positioned between the diffusion barrier layer 500 and the first lower protection layer 140*a*, and between the diffusion barrier layer 500 and the first upper protection layer 140*b*. In some cases, the diffusion barrier layer 500 may be positioned on the first protection layer 140. In other words, the diffusion barrier layer 500 may be positioned between the first protection layer 140 and the capping layer 190. The semiconductor device includes a diffusion barrier layer 500, thereby preventing materials diffused from the capping layer 190 from reaching the channel layer 132, which may improve device characteristics.

Figure 11A:
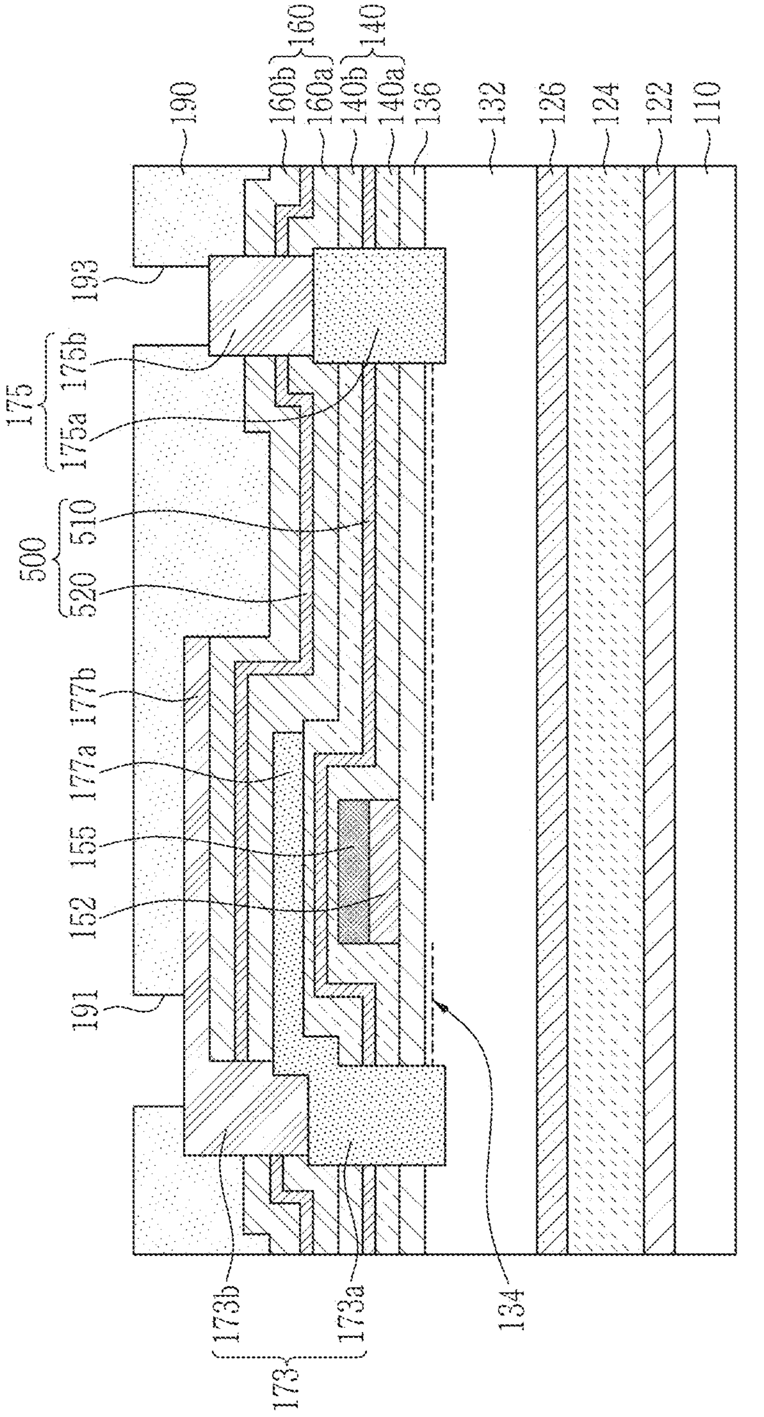

As shown FIG. 11A, the diffusion barrier layer 500 may include a first diffusion barrier layer 510 and a second diffusion barrier layer 520. The first diffusion barrier layer 510 may be positioned within the first protection layer 140, and the second diffusion barrier layer 520 may be positioned within the second protection layer 160. The first diffusion barrier layer 510 may be positioned between the first lower protection layer 140*a* and the first upper protection layer 140*b*. The second diffusion barrier layer 520 may be positioned between the second lower protection layer 160*a* and the second upper protection layer 160*b*.

However, it is not limited to this, and the positions of the first diffusion barrier layer 510 and the second diffusion barrier layer 520 may be changed in various ways. The semiconductor device may include a plurality of diffusion barrier layers 500, and each of the plurality of diffusion barrier layers 500 may be formed in a position corresponding to one of the implementations described above. In other words, by combining two or more of the above-described implementations, the semiconductor device including the plurality of diffusion barrier layers 500 may be formed. For example, the first diffusion barrier layer 510 can be positioned between the first protection layer 140 and the second protection layer 160, and the second diffusion barrier layer 520 can be positioned between the second protection layer 160 and the capping layer 190. As another example, the first diffusion barrier layer 510 and the second diffusion barrier layer 520 may be positioned between the first protection layer 140 and the second protection layer 160. At this time, the upper surface of the first diffusion barrier layer 510 may be in contact with the bottom surface of the first field dispersion layer 177*a*, and the bottom surface of the second diffusion barrier layer 520 be in contact with the upper surface of the first field dispersion layer 177*a*.

Additionally, the number of layers constituting the diffusion barrier layer 500 may be changed in various ways. For example, the diffusion barrier layer 500 may include three or more layers. The diffusion barrier layer 500 may include a layer positioned within the first protection layer 140, a layer positioned between the first protection layer 140 and the second protection layer 160, and a layer positioned between the second protection layer 160 and the capping layer 190.

The semiconductor device includes the diffusion barrier layer 500, thereby preventing materials diffused from the capping layer 190 from reaching the channel layer 132, thereby improving device characteristics.

Figure 11B:
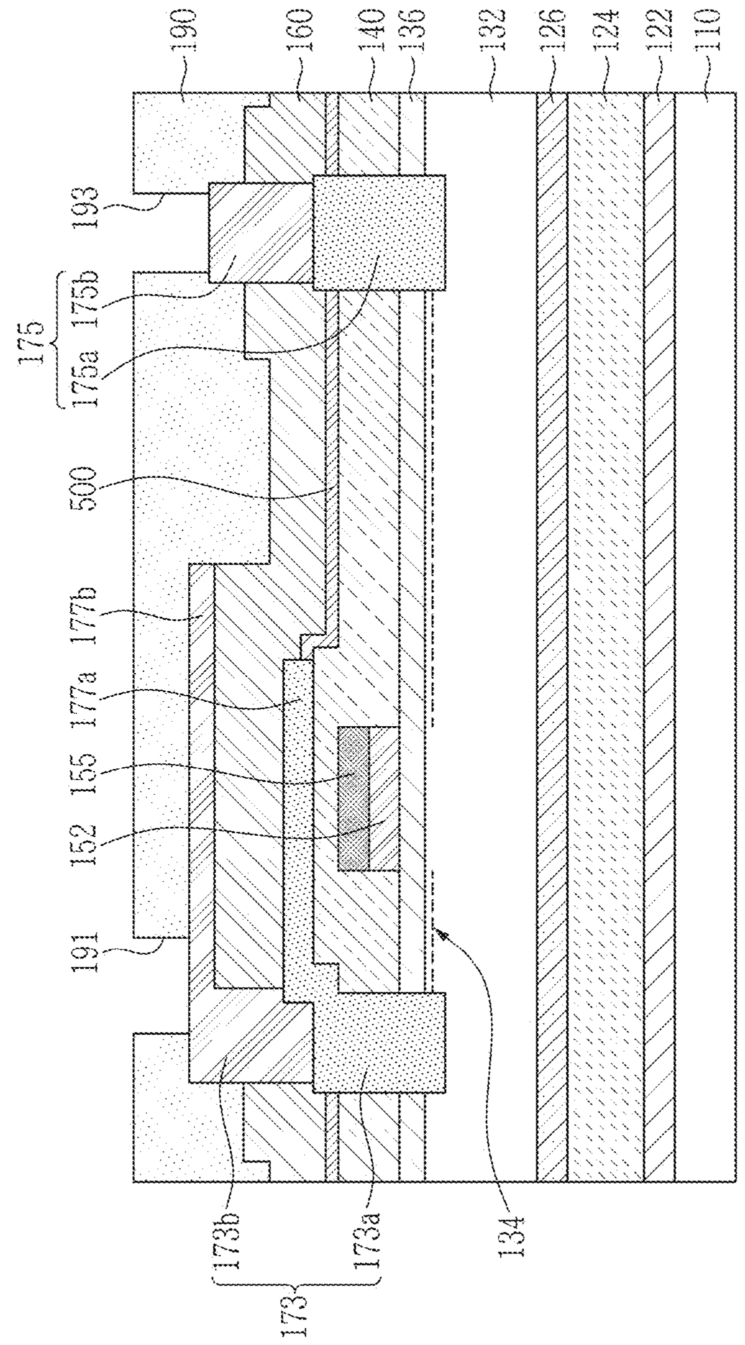

As shown in FIG. 11B, the diffusion barrier layer 500 may be positioned between the first protection layer 140 and the second protection layer 160. The bottom surface of the diffusion barrier layer 500 may be in contact with the first protection layer 140. The side of the diffusion barrier layer 500 may be in contact with the first source electrode 173*a* and the first drain electrode 175*a*. Additionally, the side of the diffusion barrier layer 500 may be in contact with the side of the first field dispersion layer 177*a*. The upper surface of the diffusion barrier layer 500 may be in contact with the second protection layer 160. At this time, the diffusion barrier layer 500 may not be in contact with the second source electrode 173*b* and the second drain electrode 175*b*. Additionally, the diffusion barrier layer 500 may not cover the upper surface of the first field dispersion layer 177*a*. That is, the diffusion barrier layer 500 may be not in contact with the upper surface of the first field dispersion layer 177*a*.

Although not shown, as another example, the diffusion barrier layer 500 may be positioned on the second protection layer 160 and may be also in contact with the side of the second field dispersion layer 177*b*. At this time, the upper surface of the diffusion barrier layer 500 may be in contact with the second protection layer 160, and the side surface of the diffusion barrier layer 500 may be in contact with the second source electrode 173*b* and the second drain electrode 175*b*. Additionally, the upper surface of the diffusion barrier layer 500 may be in contact with the capping layer 190. In some cases, if the third protection layer is further positioned between the second protection layer 160 and the capping layer 190, the upper surface of the diffusion barrier layer 500 may be in contact with the third protection layer. The diffusion barrier layer 500 may be not in contact with the upper surface of second field dispersion layer 177*b*.

Next, a method of manufacturing a semiconductor device according to an implementation is described with reference to FIG. 12 to FIG. 21.

FIG. 12 to FIG. 21 are process cross-sectional views shown according to a process order of manufacturing an example of a semiconductor device.

Figure 12:
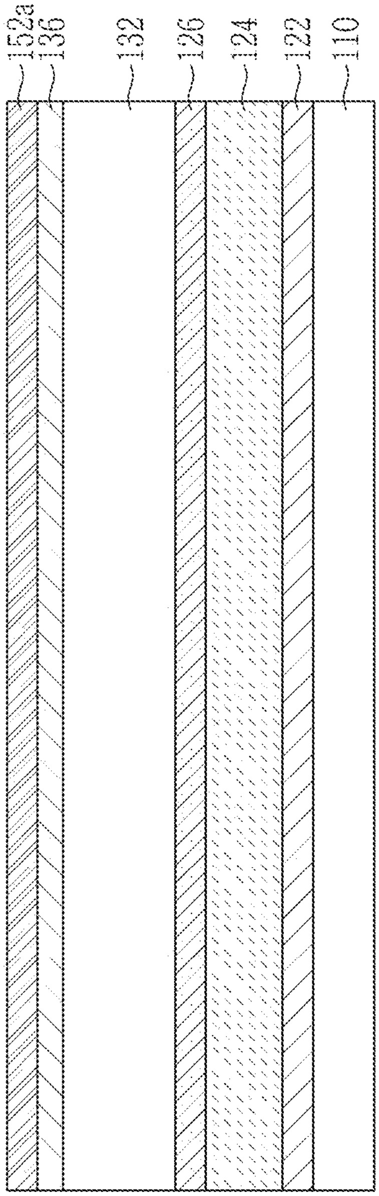
FIG. 12 to FIG. 21 are process cross-sectional views shown according to a process order of manufacturing an example of a semiconductor device.

First, as shown in FIG. 12, a buffer layer 122, a superlattice layer 124, a high-resistance layer 126, a channel layer 132, a barrier layer 136, and a gate semiconductor material layer 152*a* may be sequentially formed on a substrate 110.

The substrate 110 may include a semiconductor material. For example, the substrate 110 may include sapphire, Si, SiC, AlN, GaN, or a combination thereof. The substrate 110 may be a silicon on insulator (SOI) substrate. However, the material of the substrate 110 is not limited to this, and any generally-used substrate may be applied.

The buffer layer 122, the superlattice layer 124, the high-resistance layer 126, the channel layer 132, the barrier layer 136, and the gate semiconductor material layer 152*a* may be formed sequentially using an epitaxial growth method. The buffer layer 122 may be formed on the substrate 110 first, the superlattice layer 124 may be formed on the buffer layer 122, and the high-resistance layer 126 may be formed on the superlattice layer 124. Next, the channel layer 132 may be formed on the high-resistance layer 126, the barrier layer 136 may be formed on the channel layer 132, and the gate semiconductor material layer 152*a* may be formed on the barrier layer 136. Although not shown, a seed layer may be further formed before forming the buffer layer 122 on the substrate 110. In the final structure of the semiconductor device, the seed layer may be positioned between the substrate 110 and the buffer layer 122. The seed layer is a layer that serves as a seed for growing the buffer layer 122, and may be made of a crystal lattice structure that becomes the seed of the buffer layer 122.

The buffer layer 122, the superlattice layer 124, the high-resistance layer 126, the channel layer 132, the barrier layer 136, and the gate semiconductor material layer 152*a* may be made of the same-based semiconductor material. However, the material composition ratio of each layer may be different considering the role of each layer and the performance required for the semiconductor device, the like. The buffer layer 122, the superlattice layer 124, the high-resistance layer 126, the channel layer 132, the barrier layer 136, and the gate semiconductor material layer 152*a* may include one or more materials selected from Group III-V materials, for example, nitrides at least one among Al, Ga, In, and B. The buffer layer 122, the superlattice layer 124, the high-resistance layer 126, the channel layer 132, the barrier layer 136, and the gate semiconductor material layer 152*a* may be $Al_xIn_yGa_{1-x-y}N$ ($0 \le x \le 1$, $0 \le y \le 1$, $x+y \le 1$). For example, the buffer layer 122, the superlattice layer 124, the high-resistance layer 126, the channel layer 132, the barrier layer 136, and the gate semiconductor material layer 152*a* may include at least one among AlN, GaN, InN, InGaN, AlGaN, AlInN, AlInGaN. The barrier layer 136 may include a material having a different energy band gap than the channel layer 132. The barrier layer 136 may have a higher energy band gap than the channel layer 132. The gate semiconductor material layer 152*a* may include a material having a different energy band gap than the barrier layer 136.

As an example, the substrate 110 may include Si, the buffer layer 122 may include GaN, and the superlattice layer 124 may have a structure in which a layer made of AlGaN and a layer made of GaN are repeatedly stacked. The high-resistance layer 126 may include GaN, the channel layer 132 may include GaN, and the barrier layer 136 may include AlGaN. The channel layer 132 and the barrier layer 136 may or may not be impurity doped. The gate semiconductor material layer 152*a* may include GaN and may be doped with an impurity. The gate semiconductor material layer 152*a* may be doped with a P-type impurity, for example, magnesium (Mg).

As the lattice structure of Si and the lattice structure of GaN are different, it may not be easy to grow the channel layer 132 made of GaN directly on the substrate 110 made of Si. In the method of manufacturing the semiconductor device, the buffer layer 122, the superlattice layer 124, etc. are first formed on the substrate 110, and then the channel layer 132 is formed, so that the lattice structure of the channel layer 132 may be formed stably.

Figure 13:
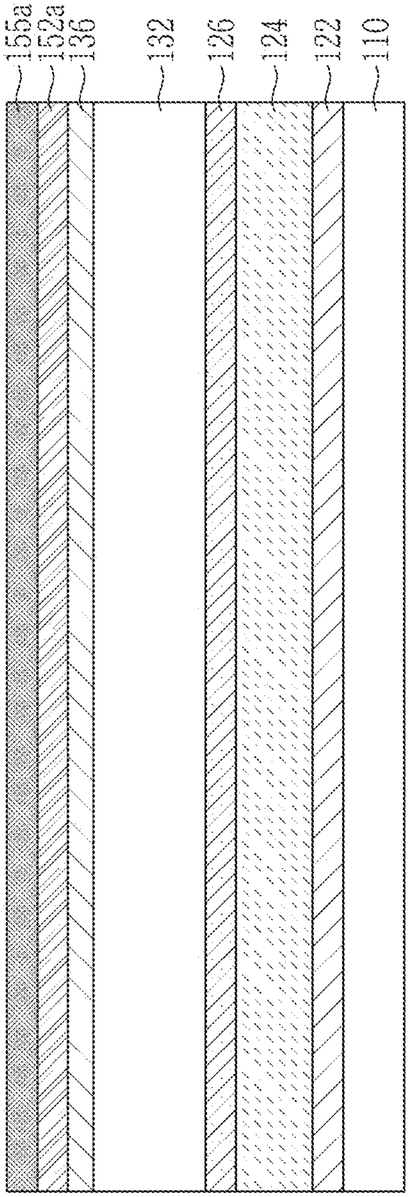
Figure 14:
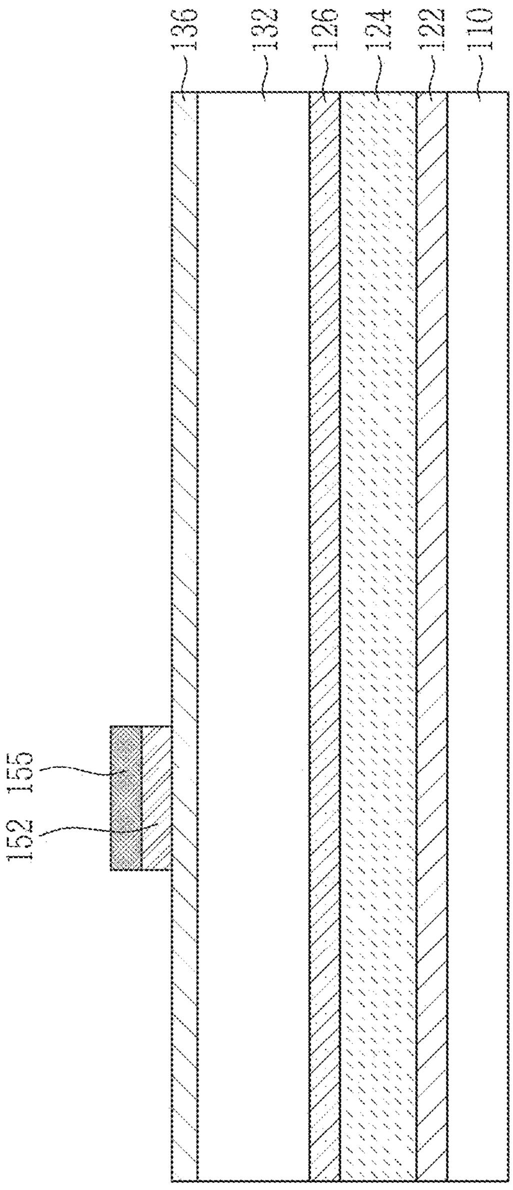

As shown in FIG. 13, a gate electrode material layer 155*a* may be formed on the gate semiconductor material layer 152*a*. The gate semiconductor material layer 152*a* is positioned between the barrier layer 136 and the gate electrode material layer 155*a*.

The gate electrode material layer 155*a* may be formed using a deposition process. For example, the gate electrode material layer 155*a* may be formed using at least one of a physical vapor deposition (PVD), a thermal chemical vapor deposition (a thermal CVD), a low pressure chemical vapor deposition (LP-CVD), a plasma enhanced chemical vapor deposition (PE-CVD), or an atomic layer deposition (ALD) technologies, but it is not limited thereto.

The gate electrode material layer 155*a* may include a conductive material. For example, the gate electrode material layer 155*a* may include a metal, a metal alloy, a conductive metal nitride, a metal silicide, a doped semiconductor material, a conductive metal oxide, or a conductive metal oxynitride, the like. For example, the gate electrode material layer 155*a* may include titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonizationnitride (TiAlC—N), titanium aluminum carbide (TiAlC), titanium carbide (TIC), tantalum carbonizationnitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or combination thereof, but it is not limited thereto. The gate electrode material layer 155*a* may be made of a single layer or multiple layers.

Figure 15:
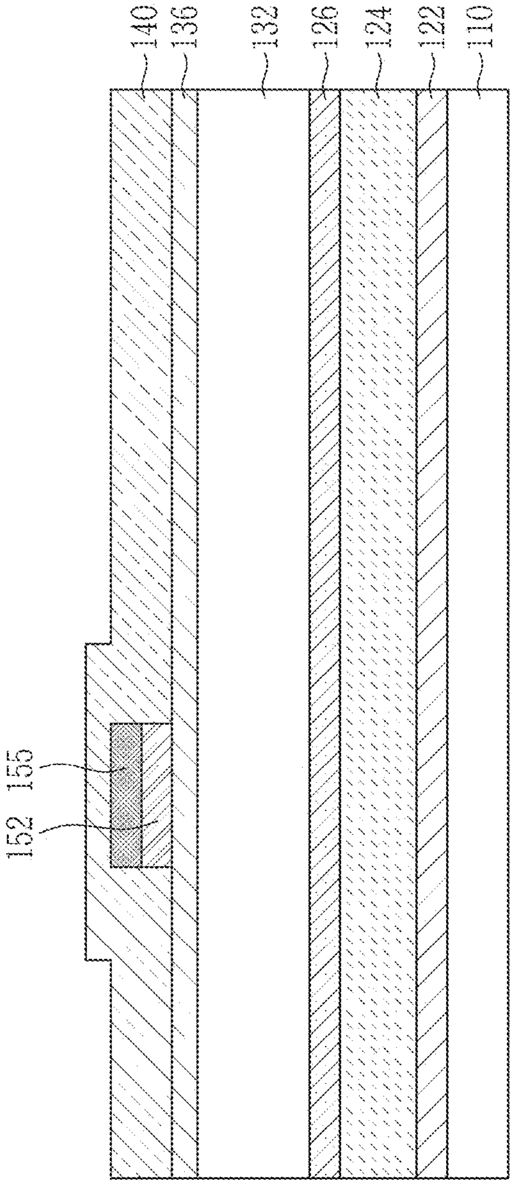

Next, by patterning the gate electrode material layer 155*a* and the gate semiconductor material layer 152*a* by using a photo and etching process, as shown in FIG. 15, a gate electrode 155 and a gate semiconductor layer 152 may be formed.

For example, a hard mask layer and a photoresist layer may be formed sequentially on the gate electrode material layer 155*a*. A photoresist pattern may be formed by patterning the photoresist layer by using a photo process. The hard mask pattern may be formed by etching the hard mask layer using the photoresist pattern as a mask. By continuously etching the gate electrode material layer 155*a* and the gate semiconductor material layer 152*a* by using the hard mask pattern as a mask, at least a portion of the gate electrode material layer 155*a* and the gate semiconductor material layer 152*a* may be removed. Accordingly, the remaining portion of the gate electrode material layer 155*a* may become the gate electrode 155. Additionally, the portion of the gate semiconductor material layer 152*a* that remains may become the gate semiconductor layer 152. The gate semiconductor layer 152 is positioned between the barrier layer 136 and the gate electrode 155. The gate electrode 155 may be in schottky contact or ohmic contact to the gate semiconductor layer 152.

By patterning the gate semiconductor material layer 152*a* and the gate electrode material layer 155*a* using the same mask, the gate semiconductor layer 152 and the gate electrode 155 may have the same pattern. That is, the gate semiconductor layer 152 and the gate electrode 155 may have the same planar shape. In the cross-section, the gate semiconductor layer 152 and the gate electrode 155 may have the same width. The gate semiconductor layer 152 may completely overlap the gate electrode 155 in the vertical direction, and the upper surface of the gate semiconductor layer 152 may be entirely covered by the gate electrode 155.

In order to minimize a damage to the barrier layer 136 in the process of etching the gate semiconductor material layer 152*a*, a selective etching process condition is required to have a difference in the etch rate of the gate semiconductor material layer 152*a* and the barrier layer 136. For example, while the barrier layer 136 made of AlGaN is hardly etched, the gate semiconductor material layer 152*a* made of p-GaN may be easily etched. At this time, a surface oxidation etching method may be used by adding oxygen ($O_2$) to an etching gas. Accordingly, if the barrier layer 136 is not damaged and has a predetermined thickness, the channel layer 132 may have a high current density.

As shown in FIG. 15, a first protection layer 140 may be formed on the barrier layer 136 and the gate electrode 155.

The first protection layer 140 may be formed using a deposition process. The first protection layer 140 may include insulating material. For example, the first protection layer 140 may include materials such as SiO2, SiN, SION, Al2O3, etc. The first protection layer 140 is shown as a single layer, but in some cases it may be comprised of multiple layers. At this time, different materials may be deposited sequentially to form the first protection layer 140. Alternatively, by using the same material and varying the deposition conditions, the first protection layer 140 consisting of several layers with different characteristics may be formed. Particularly, the part of the first protection layer 140 adjacent to the barrier layer 136 may be made of an insulating material of much better quality than other parts. This is to prevent electrons forming a channel from being trapped within the channel layer 132 positioned below the barrier layer 136. The portion of the first protection layer 140 that is in contact with the barrier layer 136 may be made of $SiO_2$.

The side surfaces of the gate electrode 155 and the gate semiconductor layer 152 may be covered by the first protection layer 140. The side surfaces of the gate electrode 155 and the gate semiconductor layer 152 may be in contact with the first protection layer 140. A step may occur between the portion of the first protection layer 140 that overlaps the gate electrode 155 and the gate semiconductor layer 152 and the remaining portion. However, it is not limited to this, and in some cases, the upper surface of the first protection layer 140 may be entirely flat. For example, if the thickness of the first protection layer 140 is relatively thick, a step may not occur between the portion of the first protection layer 140 that overlaps the gate electrode 155 and the gate semiconductor layer 152 and the remaining portion.

Figure 16:
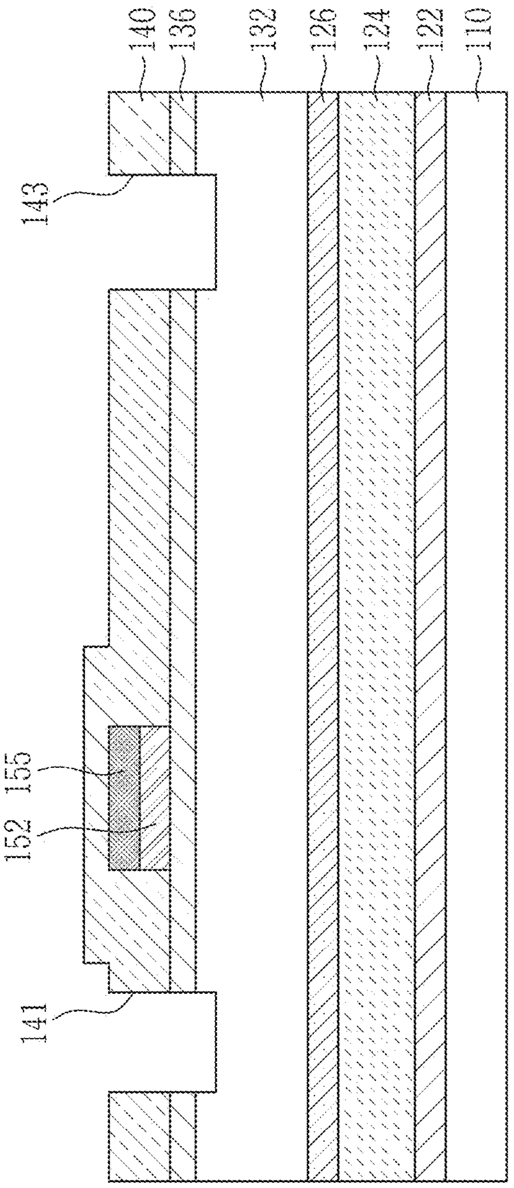

As shown in FIG. 16, by patterning the first protection layer 140 using a photo and etching process, a first trench 141 and a second trench 143 may be formed. At this time, not only the first protection layer 140 but also the barrier layer 136 and the channel layer 132 can be patterned together.

For example, a photoresist pattern may be formed on the first protection layer 140, and the first protection layer 140, the barrier layer 136, and the channel layer 132 may be sequentially etched using this as a mask. At this time, the first protection layer 140 and the barrier layer 136 may be penetrated by the first trench 141 and the second trench 143, and the upper surface of the channel layer 132 may be recessed. The channel layer 132 may not be penetrated by the first trench 141 or the second trench 143. That is, the depth at which the upper surface of the channel layer 132 is recessed may be smaller than the entire thickness of the channel layer 132. At this time, the depth at which the upper surface of the channel layer 132 is recessed may be much smaller than the entire thickness of the channel layer 132. For example, the depth at which the upper surface of the channel layer 132 is recessed may be about 0% to about 30% of the entire thickness of the channel layer 132. Additionally, the depth at which the upper surface of the channel layer 132 is recessed may be smaller than the thickness of the barrier layer 136. However, it is not limited to this, and the depth at which the upper surface of the channel layer 132 is recessed may be changed in various ways. The side surfaces of the first protection layer 140 and the barrier layer 136 may be exposed to the outside by the first trench 141 and the second trench 143, and the top and side surfaces of the channel layer 132 may be exposed. The channel layer 132 may form the bottom surface and sidewall of the first trench 141 and the second trench 143, and the barrier layer 136 may form the sidewall of the first trench 141 and the second trench 143.

The first trench 141 and the second trench 143 may be spaced apart from each other. The first trench 141 and the second trench 143 may be positioned on both sides of the gate electrode 155. The first trench 141 may be positioned on one side of the gate electrode 155 to be spaced apart from the gate electrode 155. The second trench 143 may be positioned on the other side of the gate electrode 155 to be spaced apart from the gate electrode 155. The distance that the first trench 141 is separated from the gate electrode 155 may be smaller than the distance that the second trench 143 is separated from the gate electrode 155. The shapes such as the widths and the depths of first trench 141 and the second trench 143 are shown to be similar, but are not limited thereto. The shapes of the first trench 141 and the second trench 143 may be changed in various ways.

Figure 17:
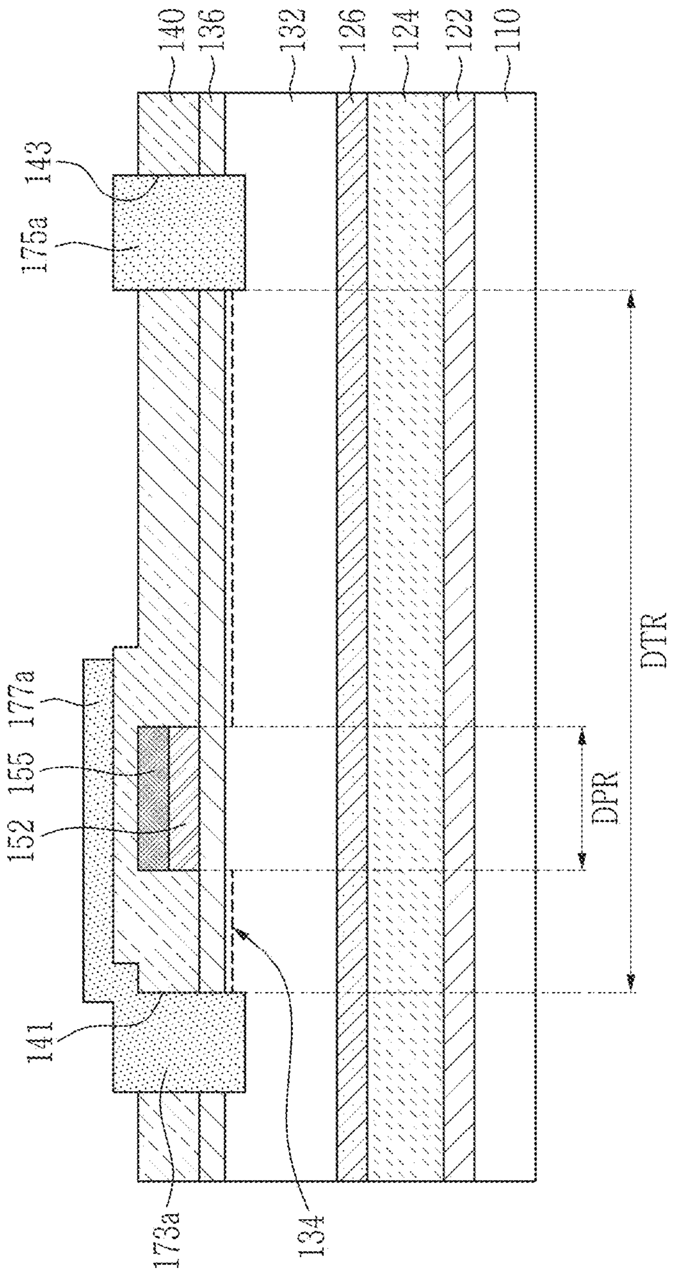

As shown in FIG. 17, a conductive material may be deposited on the first protection layer 140 on which the first trench 141 and the second trench 143 are formed, and patterned to form a first source electrode 173*a* and a first drain electrode 175*a*.

The first source electrode 173*a* and the first drain electrode 175*a* may include a conductive material. For example, the first source electrode 173*a* and the first drain electrode 175*a* may include a metal, a metal alloy, a conductive metal nitride, a metal silicide, a doped semiconductor material, a conductive metal oxide, or a conductive metal oxynitride. The first source electrode 173*a* and the first drain electrode 175*a* may be made of a single layer or multiple layers. For example, a plurality of conductive layers including different materials may be stacked and then patterned to form the first source electrode 173*a* and the first drain electrode 175*a*. At this time, the plurality of conductive layers may be etched simultaneously or sequentially using one mask pattern. For example, Ti, Al, Ti, and TiN may be accumulated sequentially and then patterned to form the first source electrode

173*a* and the first drain electrode 175*a*. At this time, the thickness of the four conductive layers constituting the first source electrode 173*a* and the first drain electrode 175*a* may be similar or different. For example, a layer made of Al may be relatively thick compared to other layers.

The first source electrode 173*a* may be formed to fill the interior of the first trench 141. Within the first trench 141, the first source electrode 173*a* may be in contact with the channel layer 132 and the barrier layer 136. The first source electrode 173*a* may be in contact with the side surfaces of the channel layer 132 and the barrier layer 136. The first source electrode 173*a* may cover the side surfaces of the channel layer 132 and the barrier layer 136. The first source electrode 173*a* may be electrically connected to the channel layer 132 through the first trench 141. The upper surface of the first source electrode 173*a* may be protruded from the upper surface of the first protection layer 140.

The first drain electrode 175*a* may be formed to fill the interior of the second trench 143. Within the second trench 143, the first drain electrode 175*a* may be in contact with the channel layer 132 and the barrier layer 136. The first drain electrode 175*a* may be in contact with the side surfaces of the channel layer 132 and the barrier layer 136. The first drain electrode 175*a* may cover the side surfaces of the channel layer 132 and the barrier layer 136. The first drain electrode 175*a* may be electrically connected to the channel layer 132 through the second trench 143. The upper surface of the first drain electrode 175*a* may be protruded from the upper surface of the first protection layer 140.

The first source electrode 173*a* and the first drain electrode 175*a* may be in ohmic contact with the channel layer 132. The region in contact with the first source electrode 173*a* and the first drain electrode 175*a* within the channel layer 132 may be doped at a relatively high concentration compared to other regions. For example, the channel layer 132 may be doped by an ion implant process, an annealing process, etc. However, it is not limited to this, and the doping process of the channel layer 132 may be comprised of various other processes. The doping process of the channel layer 132 may be performed before forming the first source electrode 173*a* and the first drain electrode 175*a*. In some cases, the channel layer 132 may not be doped.

Inside the channel layer 132, the 2-dimensional electron gas 134 may be formed in the portion adjacent to the barrier layer 136. The 2-dimensional electron gas 134 may be positioned at the interface between the channel layer 132 and the barrier layer 136. The 2-dimensional electron gas 134 may be positioned in the drift region DTR between the first source electrode 173*a* and the first drain electrode 175*a*. A depletion region DPR may be formed within the channel layer 132 by the gate semiconductor layer 152 having a different energy band gap from the barrier layer 136. Accordingly, the semiconductor device may have a normally off characteristic. That is, the semiconductor device may be a normally off high electron mobility transistor (HEMT). In the gate off state, the 2-dimensional electron gas 134 can be positioned within the drift region DTR excluding the depletion region DPR of the channel layer 132. In the gate-on state, the flow of the 2-dimensional electron gas 134 continues within the depletion region DPR, allowing 2-dimensional electron gas 134 to be positioned overall within the drift region DTR.

In the step of forming the first source electrode 173*a* and the first drain electrode 175*a*, the first field dispersion layer 177*a* may be formed together. The first field dispersion layer 177*a* may be positioned between the first source electrode 173*a* and the first drain electrode 175*a*. The first field dispersion layer 177*a* may overlap the gate electrode 155. The first field dispersion layer 177*a* can be electrically connected to the first source electrode 173*a*. The first field dispersion layer 177*a* may be formed integrally with the first source electrode 173*a*. The first field dispersion layer 177*a* may include the same material as the first source electrode 173*a* and may be positioned in the same layer as the first source electrode 173*a*.

Figure 18:
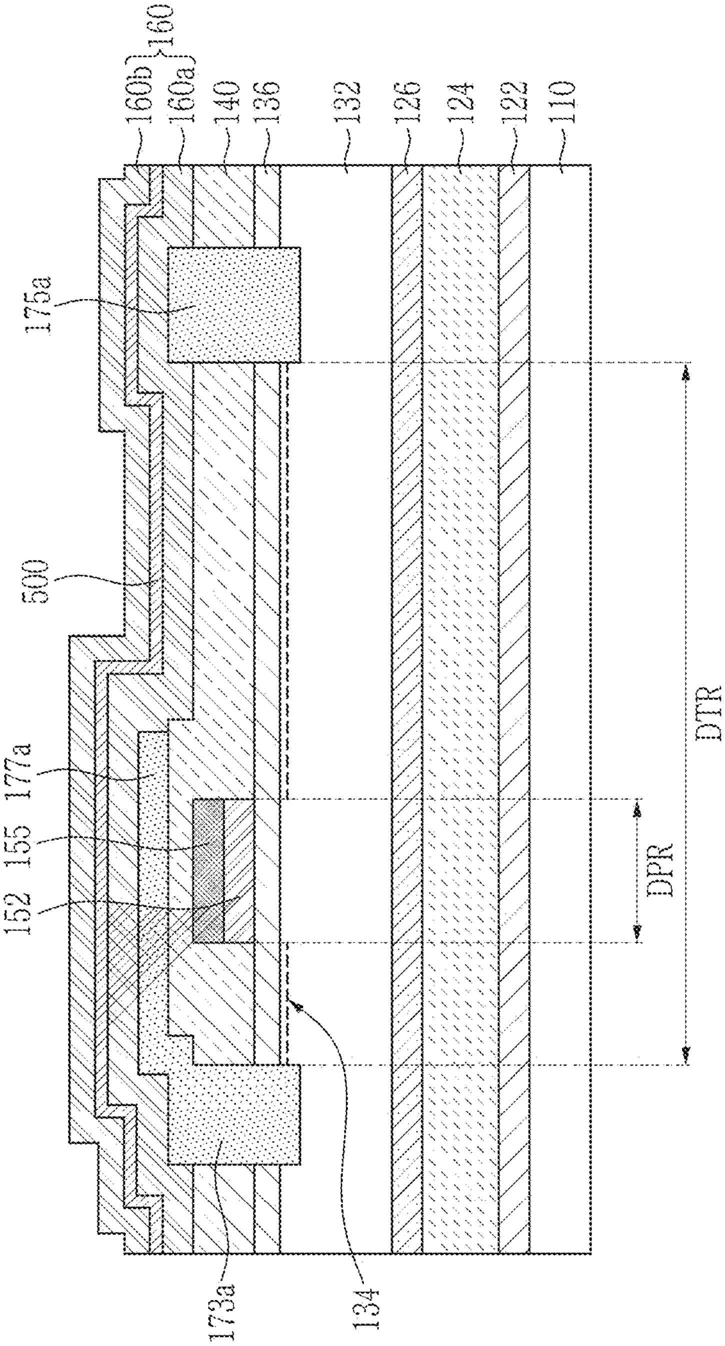

As shown in FIG. 18, a second protection layer 160 and a diffusion barrier layer 500 may be formed on the first source electrode 173*a* and the first drain electrode 175*a*. At this time, the diffusion barrier layer 500 may be positioned within the second protection layer 160. The second protection layer 160 may include a second lower protection layer 160*a* and a second upper protection layer 160*b*, and the diffusion barrier layer 500 may be positioned between the second lower protection layer 160*a* and the second upper protection layer 160*b*.

The second lower protection layer 160*a*, the diffusion barrier layer 500, and the second upper protection layer 160*b* may be formed sequentially using a deposition process. The second lower protection layer 160*a*, the diffusion barrier layer 500, and the second upper protection layer 160*b* may include an insulating material. The diffusion barrier layer 500 may include a different material from the second lower protection layer 160*a* and the second upper protection layer 160*b*. For example, the second lower protection layer 160*a* and the second upper protection layer 160*b* may include materials such as SiO2, SiN, SiON, $Al_2O_3$, etc. The second lower protection layer 160*a* and the second upper protection layer 160*b* may include the same material or different materials. The diffusion barrier layer 500 may be made of an insulating material including Nitrogen. For example, the diffusion barrier layer 500 may include materials such as SiN, SiON, SiOCN, AlN, etc. The diffusion barrier layer 500 may include a material that can prevent diffusion of ions such as F and Cl with high electron affinity. In addition, the diffusion barrier layer 500 may also prevent a diffusion of moisture or oxygen.

The first source electrode 173*a*, the first drain electrode 175*a*, the first field dispersion layer 177*a*, and the first protection layer 140 may be covered by the second protection layer 160 and the diffusion barrier layer 500. The first source electrode 173*a*, the first drain electrode 175*a*, the first field dispersion layer 177*a*, and the first protection layer 140 may be in contact with the second lower protection layer 160*a*. A step may occur between the portion of the second protection layer 160 that overlaps the first source electrode 173*a*, first drain electrode 175*a*, and first field dispersion layer 177*a* and the remaining portion. However, it is not limited to this, and in some cases, the upper surface of the second protection layer 160 may be entirely flat. For example, when the thickness of the second protection layer 160 is formed to be relatively thick, a step may not occur between the portion of the second protection layer 160 that overlaps the first source electrode 173*a*, the first drain electrode 175*a*, and the first field dispersion layer 177*a* and the remaining portion.

Figure 19:
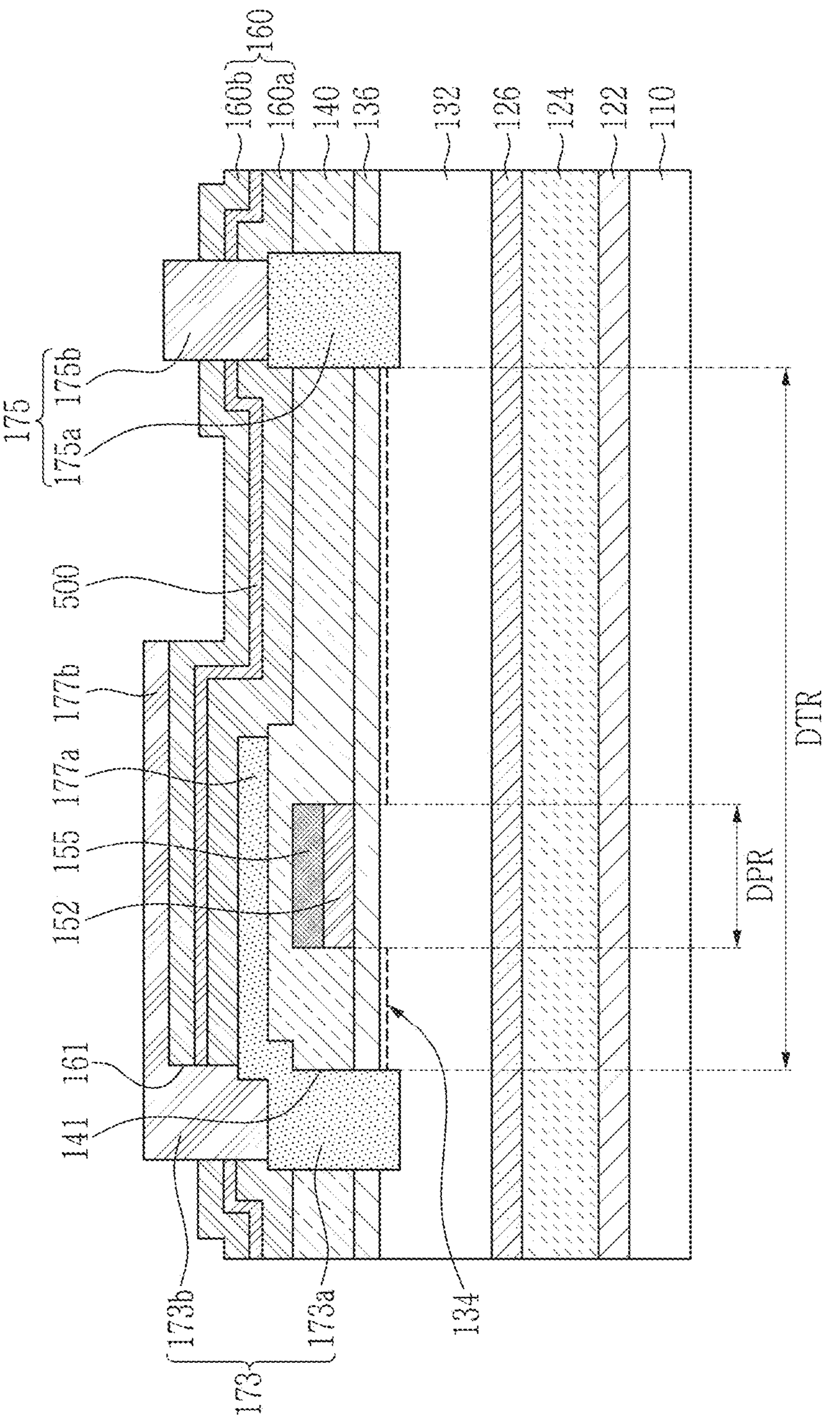

As shown in FIG. 19, a first opening 161 and a second opening 163 may be formed by patterning the second protection layer 160 and the diffusion barrier layer 500 using a photo and etching processes.

For example, a photoresist pattern may be formed on the second protection layer 160, and the second upper protection layer 160*b*, the diffusion barrier layer 500, and the second lower protection layer 160*a* may be sequentially etched using this as a mask. At this time, the second upper protection layer 160*b*, the diffusion barrier layer 500, and the second lower protection layer 160*a* may be penetrated by the first opening 161 and the second opening 163. By the first opening 161, the upper surface of the first source electrode 173*a* or first field dispersion layer 177*a* may be exposed to the outside. The upper surface of the first drain electrode 175*a* may be exposed to the outside by the second opening 163.

The first opening 161 and the second opening 163 may be spaced apart from each other. The first opening 161 and the second opening 163 may be positioned on both sides of the gate electrode 155. The first opening 161 may overlap first trench 141, and the second opening 163 may overlap second trench 143. The separation distance between the first opening 161 and the second opening 163 may be similar to the separation distance between the first trench 141 and the second trench 143. The separation distance between the first opening 161 and the gate electrode 155 may be smaller than the separation distance between the second opening 163 and the gate electrode 155. The width of the first opening 161 may be similar to the width of the first trench 141, and the width of the second opening 163 may be similar to the width of the second trench 143. However, the shape and position of first opening 161 and the second opening 163 may be changed in various ways.

Next, a conductive material may be deposited on the second protection layer 160 on which the first opening 161 and the second opening 163 are formed, and patterned to form a second source electrode 173*b* and a second drain electrode 175*b*.

The second source electrode 173*b* and the second drain electrode 175*b* may include a conductive material. For example, the second source electrode 173*b* and the second drain electrode 175*b* may include a metal, a metal alloy, a conductive metal nitride, metal silicide, a doped semiconductor material, a conductive metal oxide, or conductive metal oxynitride. The second source electrode 173*b* and the second drain electrode 175*b* may be made of a single layer or multiple layers. The second source electrode 173*b* and the second drain electrode 175*b* may include the same material as the first source electrode 173*a* and the first drain electrode 175*a* and may have the same layered structure. However, it is not limited to this, and the second source electrode 173*b* and the second drain electrode 175*b* may include a different material from the first source electrode 173*a* and the first drain electrode 175*a* and may have a different layered structure. For example, Ti, TiN, Al, and TiN may be accumulated sequentially and then patterned to form the second source electrode 173*b* and the second drain electrode 175*b*. At this time, the thickness of four conductive layers constituting the second source electrode 173*b* and the second drain electrode 175*b* may be similar or different. For example, a layer made of Al may be relatively thick compared to other layers.

The second source electrode 173*b* may be formed to fill the interior of the first opening 161. Within the first opening 161, the second source electrode 173*b* may be in contact with the first source electrode 173*a*. The second source electrode 173*b* may be electrically connected to the first source electrode 173*a* through the first opening 161. The upper surface of the second source electrode 173*b* may be protruded from the upper surface of the second protection layer 160.

The second drain electrode 175*b* may be formed to fill the interior of the second opening 163. Within the second opening 163, the second drain electrode 175*b* may be in contact with the first drain electrode 175*a*. The second drain electrode 175*b* may be electrically connected to the first drain electrode 175*a* through the second opening 163. The upper surface of the second drain electrode 175*b* may be protruded from the upper surface of the second protection layer 160.

In the step of forming the second source electrode 173*b* and the second drain electrode 175*b*, the second field dispersion layer 177*b* may be formed together. The second field dispersion layer 177*b* may be positioned between the second source electrode 173*b* and the second drain electrode 175*b*. The second field dispersion layer 177*b* may overlap the gate electrode 155. The second field dispersion layer 177*b* may overlap the first field dispersion layer 177*a*. The second field dispersion layer 177*b* may be wider than the width of the first field dispersion layer 177*a*. The second field dispersion layer 177*b* may entirely cover the first field dispersion layer 177*a*. However, it is not limited to this, and the width and the position relationship, the like of the first field dispersion layer 177*a* and the second field dispersion layer 177*b* may be changed in various ways. The second field dispersion layer 177*b* may be electrically connected to the second source electrode 173*b*. The second field dispersion layer 177*b* may be formed integrally with the second source electrode 173*b*. The second field dispersion layer 177*b* may include the same material as the second source electrode 173*b* and may be positioned in the same layer as the first source electrode 173*a*.

Figure 20:
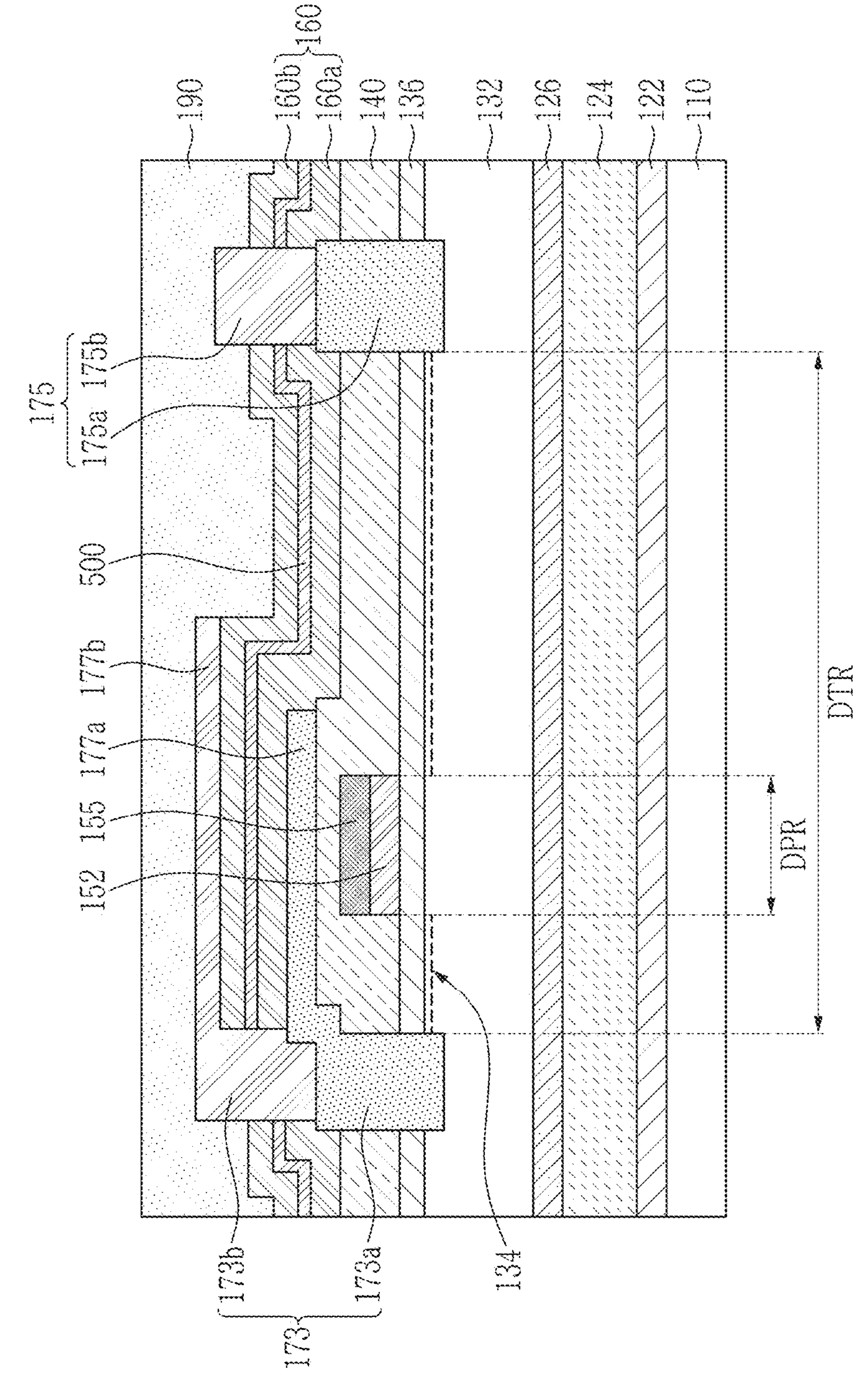

As shown in FIG. 20, a capping layer 190 may be formed on the second source electrode 173*b* and the second drain electrode 175*b*.

The capping layer 190 may include an insulating material. For example, the capping layer 190 may include materials such as polyimide (PI, polyimide), $SiO_2$, SiN, SiON, etc. The capping layer 190 may be composed of a single layer or multiple layers. The capping layer 190 is a layer positioned on the outermost side of a semiconductor device, and may have a relatively high thickness to protect the inside of the device from the outside.

Figure 21:
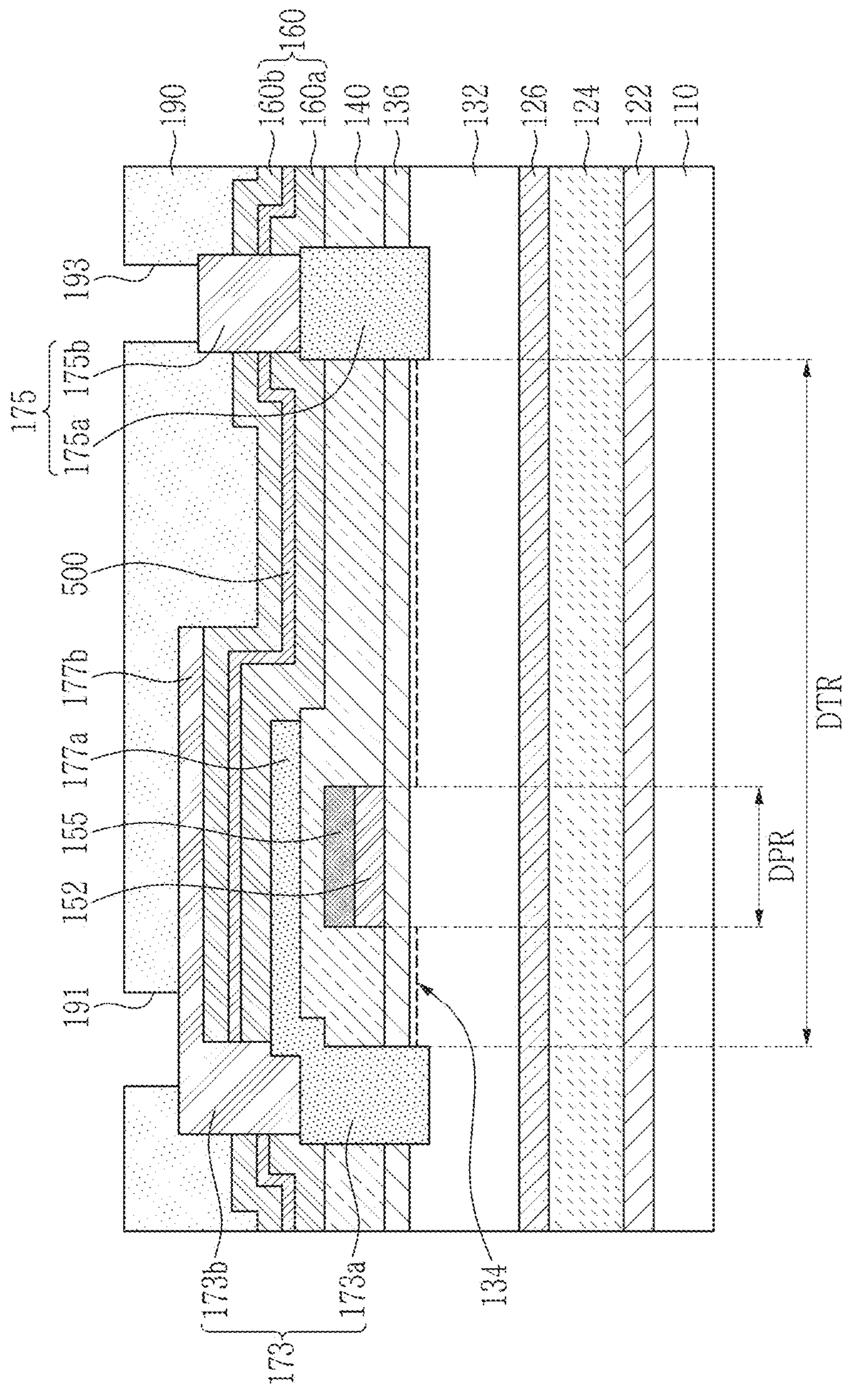

As shown in FIG. 21, by patterning the capping layer 190 using a photo and etching process, a first pad opened part 191 and a second pad opened part 193 may be formed.

A photoresist pattern may be formed on the capping layer 190, and the capping layer 190 may be etched using this as a mask. At this time, the capping layer 190 may be penetrated by the first pad opened part 191 and the second pad opened part 193. The upper surface of the second source electrode 173*b* may be exposed to the outside by the first pad opened part 191. The upper surface of the second drain electrode 175*b* may be exposed to the outside by the second pad opened part 193.

Although not shown, a wiring connected to the second source electrode 173*b* and a wiring connected to the second drain electrode 175*b* may be additionally formed in the subsequent process. A signal applied from the wiring connected to the second source electrode 173*b* may be transmitted to one region of the channel layer 132 through the second source electrode 173*b* and the first source electrode 173*a*. A signal applied from the wiring connected to the second drain electrode 175*b* may be transmitted to the other region of the channel layer 132 through the second drain electrode 175*b* and the first drain electrode 175*a*.

According to the method of manufacturing the semiconductor device, in the process of forming the second protection layer 160, by forming the diffusion barrier layer 500 within the second protection layer 160, the material diffusing from the capping layer 190 may be prevented from reaching the channel layer 132. Accordingly, a decrease in the density of the 2-dimensional electron gas 134 within the channel layer 132 may be prevented, and the characteristics of the semiconductor device may be improved.

While this specification contains many specific implementation details, these should not be construed as limitations on the scope of any invention or on the scope of what may be claimed, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

While this disclosure has been described in connection with what is presently considered to be practical exemplary implementations, it is to be understood that the disclosure is not limited to the disclosed implementations, but, on the contrary, is intended to cover various modifications and equivalent arrangements included within the spirit and scope of the appended claims.

What is claimed is:

1. A semiconductor device comprising:
a channel layer,
a barrier layer on the channel layer, the barrier layer including a material having a different energy band gap than a material included in the channel layer,
a gate electrode on the barrier layer,
a gate semiconductor layer between the barrier layer and the gate electrode,
a protection layer on the barrier layer and the gate electrode,
a source electrode and a drain electrode on both a first side and a second side of the gate electrode, extending through the protection layer, and covering a plurality of side surfaces of the channel layer and the barrier layer, and
a diffusion barrier layer within the protection layer, the diffusion barrier layer covering the barrier layer and the gate electrode and including Nitrogen.

2. The semiconductor device of claim 1, wherein:
the channel layer includes a drift region where a 2-dimensional electron gas is generated between the source electrode and the drain electrode, and
the diffusion barrier layer overlaps a drift region of the channel layer.

3. The semiconductor device of claim 2, comprising:
a capping layer on the source electrode and the drain electrode,
wherein the diffusion barrier layer is between the drift region of the channel layer and the capping layer.

4. The semiconductor device of claim 3, wherein:
the capping layer includes at least one of polyimide, $SiO_2$, SiN, or SiON.

5. The semiconductor device of claim 3, wherein:
the capping layer includes at least one of F or Cl.

6. The semiconductor device of claim 3, wherein:
the capping layer is on an outermost side of the semiconductor device.

7. The semiconductor device of claim 3, wherein:
the capping layer includes
a first pad opened part overlapping at least part of the source electrode, and
a second pad opened part overlapping at least part of the drain electrode.

8. The semiconductor device of claim 1, wherein:
the diffusion barrier layer includes at least one of SiN, SiON, SiOCN, or AlN.

9. The semiconductor device of claim 1, wherein:
the barrier layer includes a material with a higher energy band gap than a material included in the channel layer.

10. The semiconductor device of claim 1, comprising:
a field dispersion layer connected to the source electrode and covering the gate electrode.

11. The semiconductor device of claim 10, wherein:
the field dispersion layer and the source electrode are on a same layer, the field dispersion layer and the source electrode include a same material, and the field dispersion layer is integrated with the source electrode.

12. The semiconductor device of claim 1, wherein:
the source electrode includes,
a first source electrode connected to the channel layer, and
a second source electrode connected to the first source electrode and positioned on the first source electrode, and
the drain electrode includes
a first drain electrode connected to the channel layer, and
a second drain electrode connected to the first drain electrode and positioned on the first drain electrode.

13. The semiconductor device of claim 12, wherein:
the protection layer includes
a first protection layer between the gate electrode and the first source electrode and between the gate electrode and the first drain electrode, and
a second protection layer between the first source electrode and the second source electrode and between the first drain electrode and the second drain electrode.

14. The semiconductor device of claim 13, wherein:
the second protection layer includes
a second lower protection layer on the first protection layer, and
a second upper protection layer on the second lower protection layer, and
wherein the diffusion barrier layer is between the second lower protection layer and the second upper protection layer.

15. A semiconductor device comprising:
a channel layer,
a barrier layer on the channel layer, the barrier layer including a material with a higher energy band gap than a material included in the channel layer,
a gate electrode on the barrier layer,
a gate semiconductor layer between the barrier layer and the gate electrode,
a first protection layer on the gate electrode,
a first source electrode and a first drain electrode on both a first side and a second side of the gate electrode on the first protection layer and connected to the channel layer,
a first field dispersion layer overlapping the gate electrode on the first protection layer,
a second protection layer on the first source electrode, the first drain electrode, and the first field dispersion layer,
a second source electrode connected to the first source electrode on the second protection layer, a second drain electrode connected to the first drain electrode on the second protection layer, a second field dispersion layer overlapping the gate electrode on the second protection layer, a capping layer on the second source electrode, the second drain electrode, and the second field dispersion layer, and a diffusion barrier layer at least within the first protection layer, within the second protection layer, between the first protection layer and the second protection layer, and between the second protection layer and the capping layer, the diffusion barrier layer including Nitrogen.

16. The semiconductor device of claim 15, wherein:

the diffusion barrier layer includes a first diffusion barrier layer within the first protection layer, and a second diffusion barrier layer within the second protection layer.

17. The semiconductor device of claim 15, wherein:

the channel layer contains a drift region where a 2-dimensional electron gas is generated between the first source electrode and the first drain electrode, and the diffusion barrier layer overlaps the drift region of the channel layer.

18. The semiconductor device of claim 17, wherein:

the capping layer includes at least one of F or Cl, and the diffusion barrier layer contains at least one of SiN, SiON, SiOCN, or AlN.

19. A semiconductor device comprising:

a channel layer including GaN, a barrier layer on the channel layer and including AlGaN, a gate electrode on the barrier layer and including a metallic material, a gate semiconductor layer between the barrier layer and the gate electrode, the gate semiconductor layer including GaN doped with P-type impurity, a protection layer on the barrier layer and the gate electrode, a source electrode and a drain electrode on both a first side and a second side of the gate electrode, extending through the protection layer, and being in contact with a plurality of side surfaces of the channel layer and the barrier layer, a capping layer on the source electrode and the drain electrode, the capping layer including at least one of F or Cl, and a diffusion barrier layer within the protection layer, covering the barrier layer and the gate electrode, and including at least one of SiN, SiON, SiOCN, or AlN.

20. The semiconductor device of claim 19, wherein:

the channel layer includes a drift region where a 2-dimensional electron gas is generated between the source electrode and the drain electrode, and the diffusion barrier layer is between the drift region of the channel layer and the capping layer.

* * * * *